(12) United States Patent
Choi et al.

(10) Patent No.: US 11,189,358 B2
(45) Date of Patent: Nov. 30, 2021

(54) METHOD OF CONTROLLING OPERATION OF NONVOLATILE MEMORY DEVICE USING MACHINE LEARNING AND STORAGE SYSTEM

(71) Applicant: SAMSUNG ELECTRONICS CO., LTD., Suwon-si (KR)

(72) Inventors: Seonghyeog Choi, Hwaseong-si (KR); Hongrak Son, Anyang-si (KR); Taehyun Song, Suwon-si (KR); Hyunsang Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/919,187

(22) Filed: Jul. 2, 2020

(65) Prior Publication Data

US 2021/0202028 A1 Jul. 1, 2021

(30) Foreign Application Priority Data

Dec. 26, 2019 (KR) .................. 10-2019-0175273

(51) Int. Cl.
*G11C 29/42* (2006.01)
*G11C 29/44* (2006.01)
*G11C 29/50* (2006.01)
*G06N 20/20* (2019.01)
*G06N 5/04* (2006.01)
*G06K 9/62* (2006.01)

(52) U.S. Cl.
CPC ............ *G11C 29/42* (2013.01); *G06K 9/6257* (2013.01); *G06N 5/04* (2013.01); *G06N 20/20* (2019.01); *G11C 29/44* (2013.01); *G11C 29/50004* (2013.01); *G11C 2029/4402* (2013.01)

(58) Field of Classification Search
CPC ... G11C 29/42; G11C 29/50004; G11C 29/44; G11C 2029/4402; G06K 9/6257; G06N 20/20; G06N 5/04
See application file for complete search history.

(56) References Cited

U.S. PATENT DOCUMENTS

| | | |
|---|---|---|
| 9,170,897 B2 | 10/2015 | Losh et al. |
| 9,569,120 B2 | 2/2017 | Ryan et al. |
| 10,147,048 B2 | 12/2018 | Chen et al. |
| 10,210,926 B1 | 2/2019 | Amiri et al. |
| 10,289,341 B2 | 5/2019 | Kirshenbaum et al. |
| 10,394,706 B2 * | 8/2019 | Purkayastha ..... H01L 27/11556 |

(Continued)

*Primary Examiner* — Ajay Ojha
(74) *Attorney, Agent, or Firm* — Volentine, Whitt & Francos, PLLC

(57) ABSTRACT

According to a method of controlling an operation of a nonvolatile memory device using machine learning, operating conditions of the nonvolatile memory device are determined by performing an inferring operation using a machine learning model. Training data that are generated based on feature information and error information are collected, where the error information indicate results of error correction code (ECC) decoding of the nonvolatile memory device. The machine learning model is updated by performing a learning operation based on the training data. Optimized operating conditions for individual user environments are provided by collecting training data in the storage system and performing the learning operation and the inferring operation based on the training data.

19 Claims, 21 Drawing Sheets

(56) References Cited

U.S. PATENT DOCUMENTS

| | | | |
|---|---|---|---|
| 2016/0034206 A1* | 2/2016 | Ryan | G06F 12/0246 |
| | | | 711/103 |
| 2018/0108422 A1* | 4/2018 | Oh | G11C 29/028 |
| 2018/0174658 A1 | 6/2018 | Kikuchi | |
| 2018/0357535 A1 | 12/2018 | Shulkin et al. | |
| 2019/0087119 A1 | 3/2019 | Oh et al. | |
| 2020/0210831 A1* | 7/2020 | Zhang | G06N 3/04 |
| 2020/0387427 A1* | 12/2020 | Mekhanik | H03M 13/036 |

\* cited by examiner

| READ LEVEL SET | READ VOLTAGES | | | |
| --- | --- | --- | --- | --- |
| | VR1 | VR2 | ... | VRm |
| RLS1 | VL11 | VL12 | ... | VL1m |
| RLS2 | VL21 | VL22 | ... | VL2m |
| RLS3 | VL31 | VL32 | ... | VL3m |
| ⋮ | ⋮ | ⋮ | ⋮ | ⋱ | ⋮ |

METHOD OF CONTROLLING OPERATION OF NONVOLATILE MEMORY DEVICE USING MACHINE LEARNING AND STORAGE SYSTEM

CROSS-REFERENCE TO RELATED APPLICATION

This U.S. non-provisional application claims priority under 35 USC § 119 to Korean Patent Application No. 10-2019-0175273, filed on Dec. 26, 2019, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a method of controlling an operation of a nonvolatile memory device using machine learning and a storage system including a nonvolatile memory device.

2. Discussion of the Related Art

A nonvolatile memory device such as a flash memory device, a resistive memory device, etc. may store data in relation to a plurality of threshold voltage distributions, a plurality of resistance distributions, etc. Each respective "distribution" represents a corresponding logic state for stored data. Once written (or programmed) to a nonvolatile memory cell, the stored data may be read by applying predetermined read voltages. During or after the programming of a memory cell, its intended distribution may become altered or distorted by a number of events or conditions including, for example charge leakage, program disturbances, read disturbances, word and/or bit line coupling, temperature change, voltage change, degeneration of the memory cell, etc. In extreme cases, an intended distribution may become so shifted and/or broadened that a "read fail" occurs.

When a read fail occurs, certain nonvolatile memory devices may execute a different type of read operation (i.e., one having a different read sequence) than the one causing the read fail. However, it is not easy to set a read sequence that properly accounts for the many events and conditions that might have altered the distributions being read. Accordingly, "read latency" (i.e., the period of time required to read stored data) may increase as changes in the current operating conditions are assessed or identified in terms of an acceptable read sequence, and performance of the nonvolatile memory device may be degraded with extension of its read latencies.

SUMMARY

Some example embodiments may provide a method of controlling an operation of a nonvolatile memory device and a storage system performing the method capable of efficiently controlling operating conditions of the nonvolatile memory device.

According to example embodiments, a method of controlling an operation of a nonvolatile memory device using machine learning includes determining operating conditions of the nonvolatile memory device by performing an inferring operation using a machine learning model, collecting training data that are generated based on feature information and error information, the error information indicating results of error correction code (ECC) decoding of the nonvolatile memory device, and updating the machine learning model by performing a learning operation based on the training data.

According to example embodiments, a method of controlling an operation of a nonvolatile memory device using machine learning includes providing a plurality of read level sets, each read level set corresponding to a combination of levels of read voltages for a read operation of the nonvolatile memory device, determining an optimal read level set corresponding to current feature information among the plurality of read level sets by performing an inferring operation based on the current feature information as an input of a machine learning model, collecting training data that are generated based on feature information and error information, the feature information including physical addresses of the nonvolatile memory device and cell count data indicating threshold voltage distributions of memory cells corresponding to the physical addresses, the error information indicating results of error correction code (ECC) decoding of the nonvolatile memory device, updating the machine learning model by performing a learning operation based on the training data, and determining a timing of performing the learning operation based on a probability of a failure of the inferring operation and a probability of a failure of the ECC decoding.

According to example embodiments, a storage system includes a nonvolatile memory device and a storage controller configured to control the nonvolatile memory device. The storage controller includes a data collector configured to collect training data that are generated based on feature information and error information, the error information indicating results of error correction code (ECC) decoding of the nonvolatile memory device, a buffer memory configured to store the training data, and a machine learning engine configured to determine operating conditions of the nonvolatile memory device by performing an inferring operation using a machine learning model and update the machine learning model by performing a learning operation based on the training data.

The method of controlling an operation of a nonvolatile memory device and the storage system according to example embodiments may provide optimized or improved operating conditions for individual user environments by collecting training data in the storage system and performing the learning operation and the inferring operation based on the training data.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
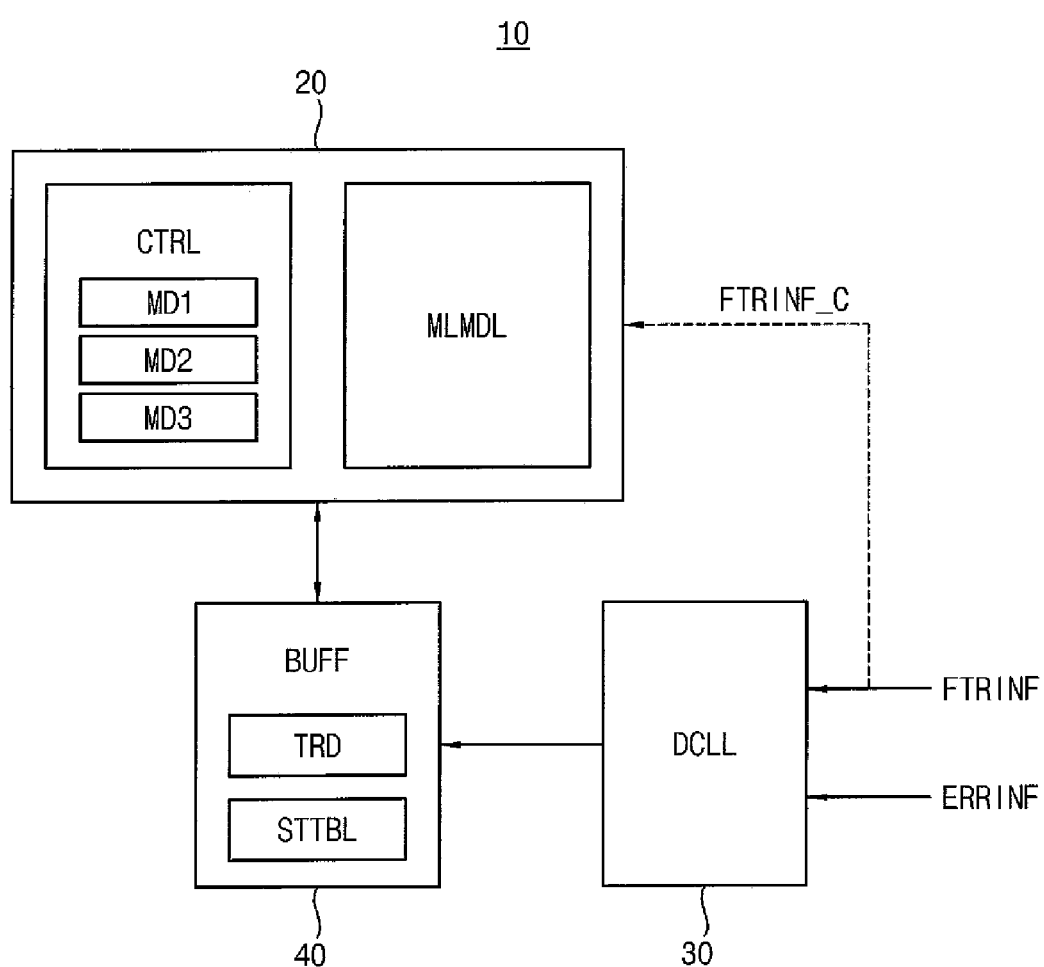
FIG. 1 is a block diagram illustrating a machine learning device included in a nonvolatile memory device according to example embodiments.

Various example embodiments will be described more fully hereinafter with reference to the accompanying drawings, in which some example embodiments are shown. In the drawings, like numerals refer to like elements throughout. Repeated descriptions may be omitted.

Figure 2:
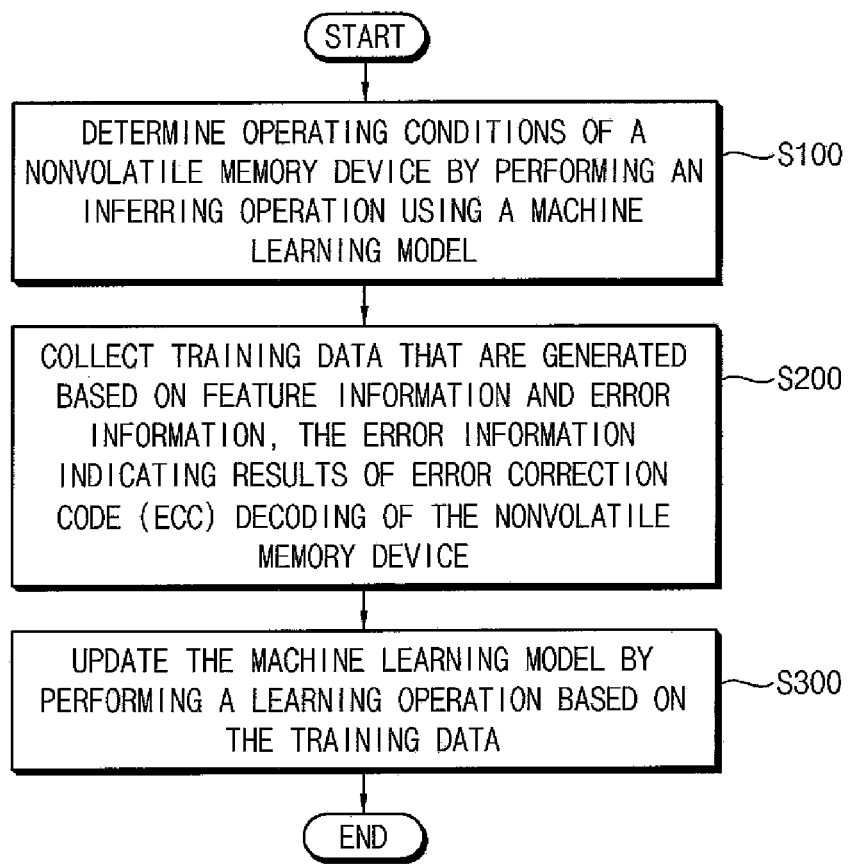
FIG. 2 is a flow chart illustrating a method of controlling an operation of a nonvolatile memory device according to example embodiments.

FIG. 1 is a block diagram illustrating a machine learning device included in a nonvolatile memory device according to example embodiments, and FIG. 2 is a flow chart illustrating a method of controlling an operation of a nonvolatile memory device according to example embodiments.

Referring to FIG. 1, a machine learning device 10 may include a machine learning engine 20, a data collector DCLL 30 and a buffer memory BUFF 40.

The machine learning engine 20 may include controller CTRL and a machine learning module MLMDL. The controller CTRL may drive the machine learning module MLMDL to update a plurality of machine learning models MD1~MD3.

In some example embodiments, updating the machine learning model may include updating weight values corresponding to the machine learning model. The weight values will be described below with reference to FIGS. 25 through 27.

As will be described below, each of the plurality of machine learning models MD1~MD3 may correspond to one of operating conditions such as a read level set, a reliability level, a read sequence, etc.

The buffer memory 40 may store data and/or information such as training data TRD, a setting table STTBL, etc.

FIG. 1 illustrates the three machine learning models MD1~MD3 for convenience of illustration, but example embodiments are not limited thereto. The number of the machine learning models may be implemented variously.

Referring to FIGS. 1 and 2, the machine learning engine 20 may determine operating conditions of the nonvolatile memory device by performing an inferring operation using a machine learning model MDi (i=1, 2, 3) (S100). The machine learning engine 20 may perform the inferring operation based on current feature information FTRINF_C as an input of the machine learning engine 20.

The data collector 30 may collect training data TRD that are generated based on feature information FTRINF and error information ERRINF, where the error information ERRINF indicate results of error correction code (ECC) decoding of the nonvolatile memory device (S200). The machine learning engine 20 may update the machine learning model MDi by performing a learning operation based on the training data TRD (S300).

The feature information FTRINF may include physical addresses of the nonvolatile memory device and cell count data indicating threshold voltage distributions of memory cells corresponding to the physical addresses. The error information ERRINF may include at least one of a probability of a failure of the ECC decoding and an error number determined by the ECC decoding.

The training data TRD may include the feature information FTRINF and results of the inferring operation that is completed successfully. In addition, the training data TRD may include an operating temperature, an operating voltage, a program and erase (P/E) cycle, a number of read operations, latencies of read, write (i.e., program) and erase operations, etc.

The controller CTRL may extract data corresponding to the machine learning model MDi from the feature information FTRINF and provide the extracted data as an input of a neural network implemented by the machine learning module MLMDL. In addition, the controller CTRL may optimize the weight values of the neural network corresponding to the machine learning model MDi. The neural network and the weight values will be described with reference to FIGS. 25 through 27.

In a storage system including a nonvolatile memory device such as a flash memory device, performance and reliability of the nonvolatile memory device may be enhanced through a prediction algorithm for determining various operating conditions, but the prediction algorithm may not reflect various user environments and characteristic variation of the nonvolatile memory device. According to example embodiments, machine learning may be used to prevent decrease in accuracy of the prediction algorithm due to the user environments and variation of workloads of the nonvolatile memory device.

As such, the method of controlling an operation of a nonvolatile memory device and the storage system according to example embodiments may provide optimized operating conditions for individual user environments by collecting training data in the storage system and performing the learning operation and the inferring operation based on the training data.

Figure 3:
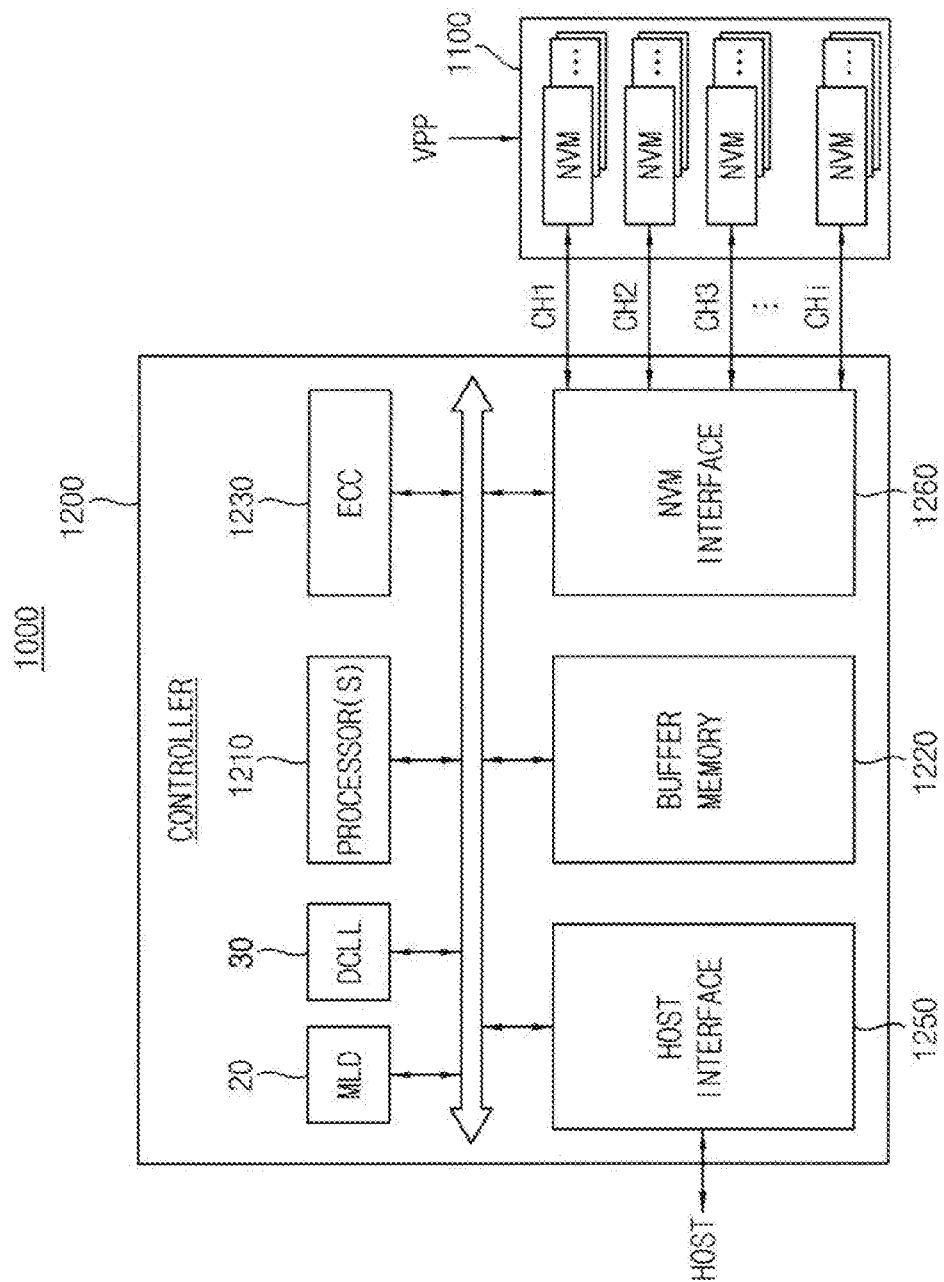
FIG. 3 is a block diagram illustrating a storage system according to example embodiments.

FIG. 3 is a block diagram illustrating a storage system according to example embodiments.

Referring to FIG. 3, a storage system 1000 includes multiple nonvolatile memory devices 1100 and a storage controller 1200. The storage system 1000 may be a memory card, a solid state drive (SSD), a universal flash storage (UFS), etc.

The nonvolatile memory device 1100 includes a memory cell array including a plurality of memory cells that store data. The nonvolatile memory devices 1100 may be configured optionally to receive a high voltage VPP. Examples of the nonvolatile memory device 1100 will be described in some additional detail with reference to FIGS. 4 through 6.

The storage controller 1200 may control the overall operation of the nonvolatile memory device 1100. The storage controller 1200 may control data transfer between an external host and the nonvolatile memory device 1100. The storage controller 1200 may include a processor 1210, such as a central processing unit (CPU), a buffer memory 1220, a host interface 1250, a memory (e.g., NVM) interface 1260, an ECC block 1230, a machine learning engine MLD 20 and a data collector DCLL 30. The processor 1210 may perform operations for the data transfer.

In some example embodiments, the buffer memory 1220 may be implemented by a static random access memory (SRAM). In other example embodiments, the buffer memory 1220 may be implemented by a dynamic random access memory (DRAM), a phase random access memory (PRAM), a ferroelectric random access memory (FRAM), a resistive random access memory (RRAM), a magnetic random access memory (MRAM), etc. According to example embodiments, the buffer memory 1220 may be located inside or outside the storage controller 1200.

The host interface 1250 may be coupled to the host, and the memory interface 1260 may be coupled to the nonvolatile memory device 1100 through multiple channels CH1, CH2, CH3, . . . , CHi. The processor 1210 may communicate with the host via the host interface 1250. For example, the host interface 1250 may be configured to communicate with the host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, the processor 1210 may communicate with the nonvolatile memory device 1100 via the memory interface 1260.

In some example embodiments, the ECC block 1230 may perform ECC encoding and ECC decoding by using a Bose-Chaudhuri-Hocquenghem (BCH) code. In other example embodiments, the ECC block 1015 may perform the ECC encoding and the ECC decoding by using a low density parity check (LDPC) code. In still other example embodiments, the ECC block 1230 may perform the ECC encoding and the ECC decoding by using a turbo code, a Reed-Solomon code, a convolution code, a recursive systematic code (RSC), a coded modulation, such as a trellis-coded modulation (TCM), a block coded modulation (BCM), etc., or other error correction codes.

According to example embodiments, the storage controller 1200 may be built in the nonvolatile memory device 1100, or the storage controller 1200 and the nonvolatile memory device 1100 may be implemented as separate chips. According to example embodiments, the ECC block 1230 may be included in the nonvolatile memory device 1100 to reduce the amount of data transfer between the storage controller 1200 and the nonvolatile memory device 1100. In this case, the nonvolatile memory device 1100 may transfer only the information about the read fail and the error bits to the storage controller 1200 in the read fail cases. The nonvolatile memory device 1100 may provide the valid read data, which may be obtained by the ECC decoding, to the storage controller 1200 in the read success cases.

The machine learning engine 20 and the data collector 30 may be implemented to perform a method of controlling the operation of the nonvolatile memory device as described with reference to FIGS. 1 and 2. The buffer memory 40 in FIG. 1 may correspond to the buffer memory 1220 in FIG. 3. At least a portion of the machine learning engine 20 may be implemented as a program code that is executed by the processor 1210.

Figure 4:
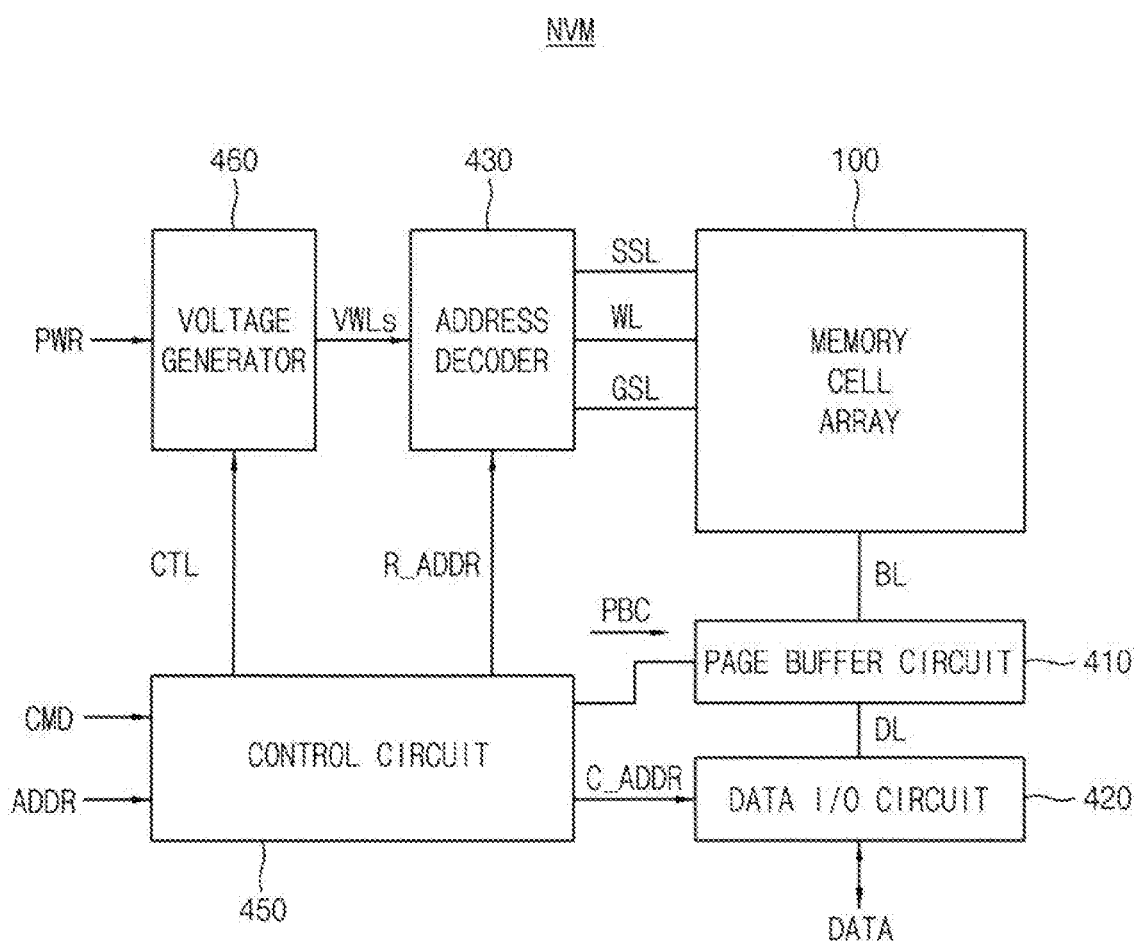
FIG. 4 is a block diagram illustrating a nonvolatile memory device according to example embodiments.

FIG. 4 is a block diagram illustrating a nonvolatile memory device according to example embodiments.

Referring to FIG. 4, the nonvolatile memory device NVM includes a memory cell array 100, a page buffer circuit 410, a data input/output circuit 420, an address decoder 430, a control circuit 450 and a voltage generator 460.

The memory cell array 100 may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command (signal) CMD and an address (signal) ADDR from the memory controller 20 and control erasure, programming and read operations of the nonvolatile memory device NVM based on the command signal CMD and the address signal ADDR. An erasure operation may comprise performing a sequence of erase loops, and a program operation may include performing a sequence of program loops. Each program loop may include a program period and a program verification period. Each erase loop may include an erase period and an erase verification period. The read operation may include a normal read operation and data recover read operation.

For example, the control circuit 450 may generate the control signals CTL, which are used for controlling the voltage generator 460, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine the rest of the plurality of word lines WL except for the selected word line as unselected word lines based on the row address R_ADDR.

In addition, during the program operation or the read operation, the address decoder 430 may determine one of the plurality of string selection lines SSL as a selected string selection line and determine the rest of the plurality of string selection lines SSL except for the selected string selection line as unselected string selection lines based on the row address R_ADDR.

The voltage generator 460 may generate word line voltages VWL, which are required for the operation of the memory cell array 100 of the nonvolatile memory device NVM, based on the control signals CTL. The voltage generator 460 may receive power PWR from the memory controller 20. The word line voltages VWL may be applied to the plurality of word lines WL through the address decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the selected word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 100 through the plurality of bit lines BL. The page buffer circuit 410 may include a plurality of buffers. In some example embodiments, each buffer may be connected to only one bit line. In other example embodiments, each buffer may be connected to two or more bit lines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 410 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

In addition, the page buffer circuit 410 and the data input/output circuit 420 may read data from a first area of the memory cell array 100 and write this read data to a second area of the memory cell array 100 (e.g., without transmitting the data to a source external to the nonvolatile memory device NVM, such as to the memory controller 20). That is, the page buffer circuit 410 and the data input/output circuit 420 may perform a copy-back operation.

Hereinafter, a first direction D1 indicates a direction perpendicular to an upper surface of a semiconductor substrate, and a second direction D2 and a third direction D3 indicate two directions parallel to the upper surface of the semiconductor substrate. For example, the second direction and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Figure 5:
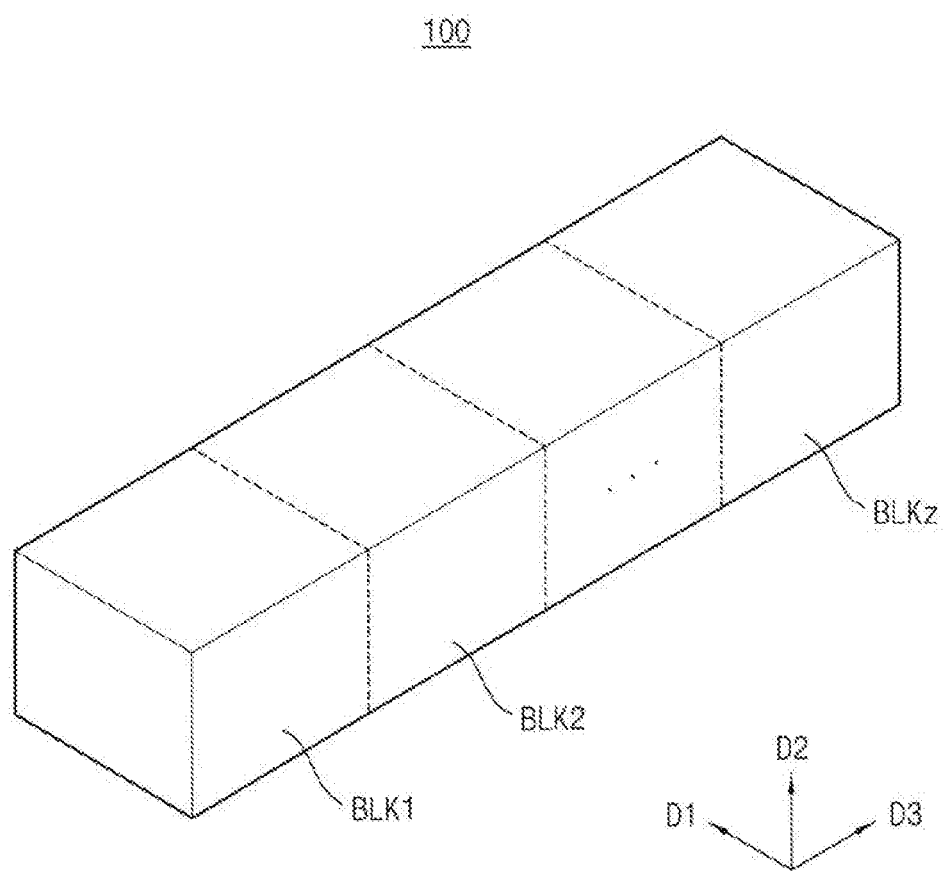
FIG. 5 is a block diagram illustrating a memory cell array included in the nonvolatile memory device of FIG. 4.
Figure 6:
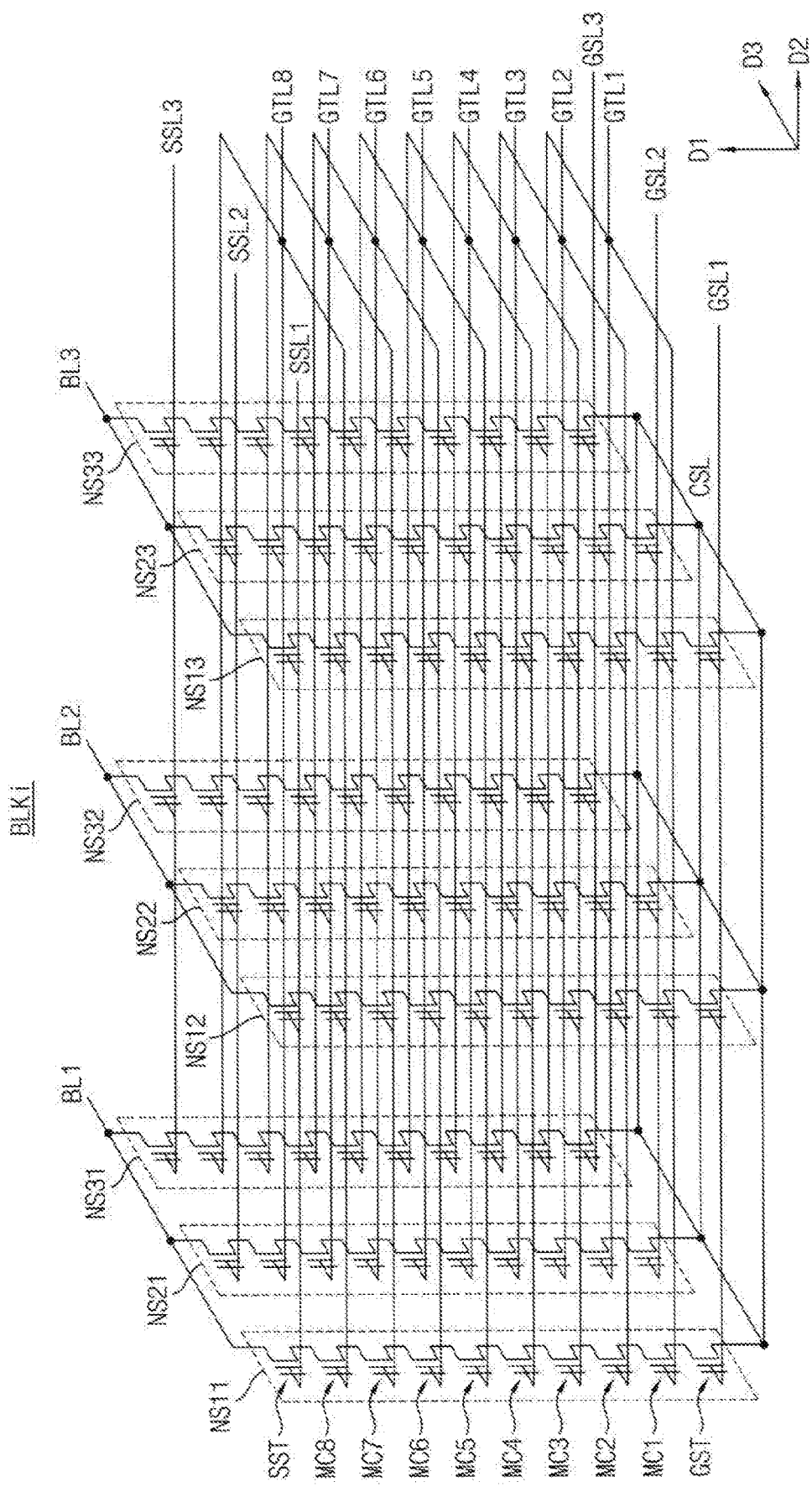
FIG. 6 is a circuit diagram illustrating an equivalent circuit of a memory block described with reference to FIG. 5.

FIG. 5 is a block diagram illustrating a memory cell array included in the nonvolatile memory device of FIG. 4, and FIG. 6 is a circuit diagram illustrating an equivalent circuit of a memory block described with reference to FIG. 5.

Referring to FIG. 5, the memory cell array 100 may include a plurality of memory blocks BLK1 to BLKz. In an example embodiment, the memory blocks BLK1 to BLKz are selected by the address decoder 430 in FIG. 4. For example, the address decoder 430 may select a particular memory block BLK corresponding to a block address among the memory blocks BLK1 to BLKz.

The memory block BLKi of FIG. 6 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 6, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 6, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. Even though not illustrated, the gate lines corresponding to the intermediate switching lines may be separated as will be described below. In FIG. 6, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

The three-dimensional NAND flash memory device or the vertical NAND flash memory has been described with reference to FIG. 6 as a nonvolatile memory device to which example embodiment applied, but example embodiments are limited to specific memory types. For example, example embodiments may be applied to various nonvolatile memory devices such as phase-change random access memory (PRAM), magnetic random access memory (MRAM), resistive random access memory (RRAM), ferroelectric random access memory (FRAM), etc.

Figure 7:
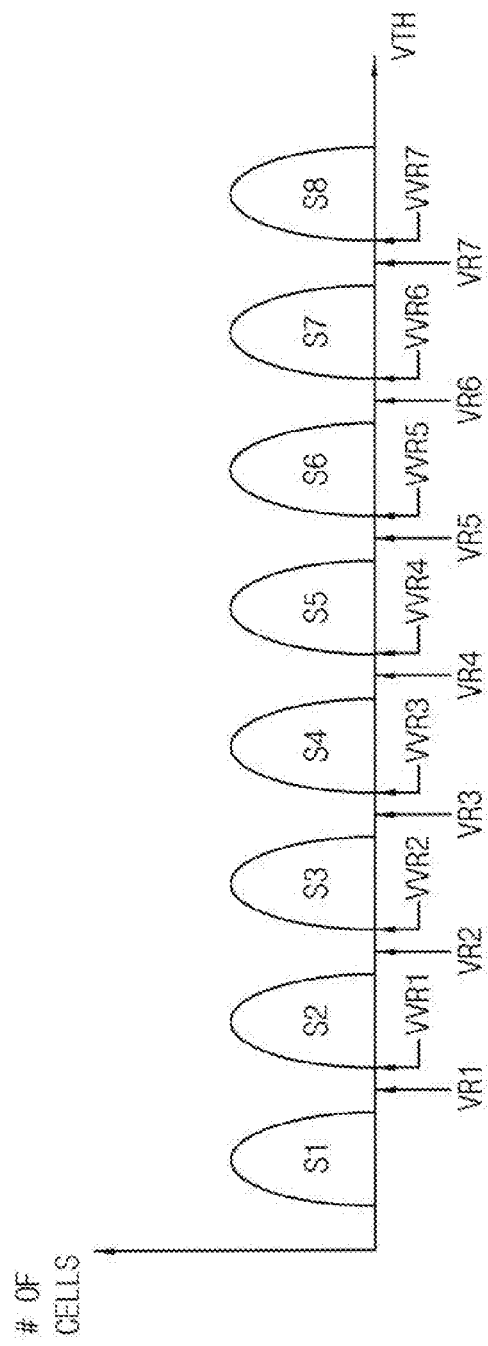
FIG. 7 is a diagram illustrating states of multi-level cells included in a nonvolatile memory device according to example embodiments.

FIG. 7 is a diagram illustrating states of multi-level cells included in a nonvolatile memory device according to example embodiments.

FIG. 7 illustrates first through eighth states S1~S8 of triple level cells (TLCs) where each TLC may store three data bits. In FIG. 7, the horizontal axis represents a threshold voltage VTH of memory cells and the vertical axis represents the number of the memory cells corresponding to the threshold voltage VTH. During the program operation, the program success of the first through eighth states S1~S8 may be distinguished by sequentially applying first through seventh verification read voltage VVR1~VVR7 to the selected word line. In addition, during the normal read operation, the first through eighth states S1~S8 may be distinguished by applying at least a portion of first through seventh normal read voltages VR1~VR7 to the selected word line as will be described below with reference to FIGS. 12 and 13.

The threshold voltage distributions of the memory cells may be shifted due to degeneration of retention characteristic associated with data retention capability of the memory cells and/or degeneration of read disturbance characteristic associated with the read operation. The errors may be caused in the read data by distortion of the threshold voltage distributions, and thus the predetermined read voltages are to be adjusted according to changes of the operating conditions. According to example embodiments, optimized operating conditions for individual user environments may be provided by performing the learning operation and the inferring operation based on the training data.

Figure 8:
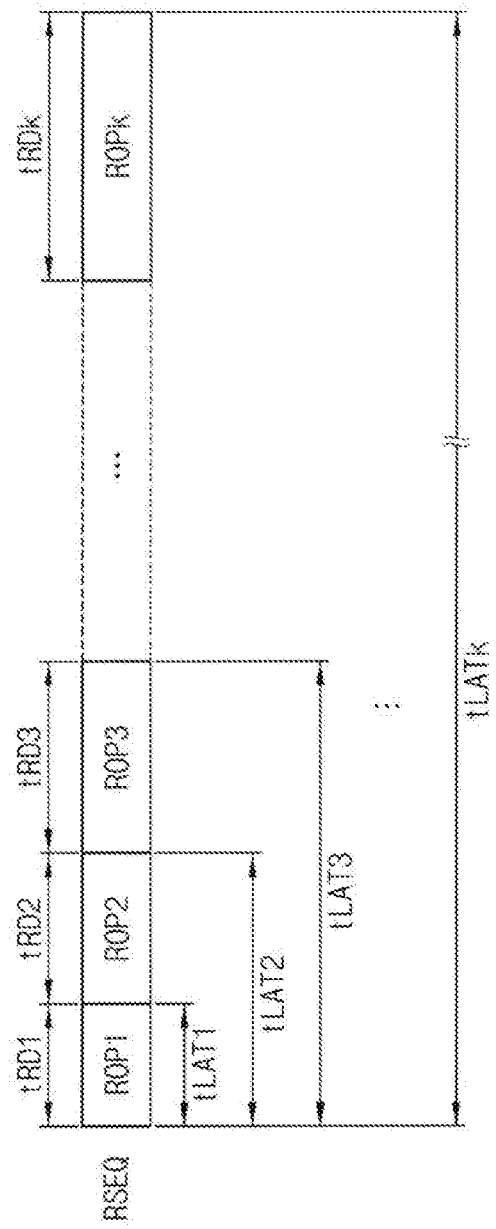
FIG. 8 is a diagram illustrating an example read sequence according to example embodiments.

FIG. 8 is a diagram illustrating an example read sequence according to example embodiments.

Referring to FIG. 8, each read sequence RSEQ may include a plurality of read operations ROP1~ROPk having respective read times tRD1~tRDk different from each other.

There is a trade-off between length of read time and the accuracy of the corresponding read operation. In other words, read operations having shorter read times also have a higher probability of a read fail outcome, while read operations having longer read times have a higher probability of a successful read operation outcome. Accordingly, each read sequence RSEQ may be set such that a read operation having the shorter read time will be performed before a read operation having the longer read time, as illustrated for example in FIG. 8. Here, the first read operation ROP1 having a shortest read time tRD1 is first performed, then a second read operation ROP2 having a second read time tRD2 longer than the first read time tRD1 is performed after the first read operation ROP1, and then a third read operation ROP3 having the third read time tRD3 longer than the second read time tRD2 is performed after the second read operation ROP2, and then so forth up to a k-th read operation ROPk having the longest read time tRDk.

Each of the read operations ROP1~ROPk may be performed using error checking and correction (ECC) decoding. The read operations ROP1~ROPk in the selected read sequence RSEQ may be performed sequentially until valid data is obtained, as properly indicated by the ECC decoding. Once valid data are obtained, later read operations will not be performed, and the read sequence RSEQ is ended.

As a result, the read latency associated with the selected read sequence corresponds to a sum of the read times of the read operations that are performed until the valid data is obtained. In the illustrated example of FIG. 8, the read latency tLAT1 corresponds to the first read time tRD1 if valid data is obtained by the first read operation ROP1, the read latency tLAT2 corresponds to a sum tRD1+tRD2 for the first read time tRD1 and the second read time tRD2 if valid data is obtained by the second read operation ROP2, the read latency tLAT3 corresponds to a sum tRD1+tRD2+ tRD3 for the first read time tRD1, the second read time tRD2 and the third read time tRD3 if valid data is obtained by the third read operation ROP3, and the read latency tLATk corresponds to a sum tRD1+tRD2+ . . . +tRDk of all read times tRD1~tRDk if valid data is obtained by the last read operation ROPk.

Figure 9:
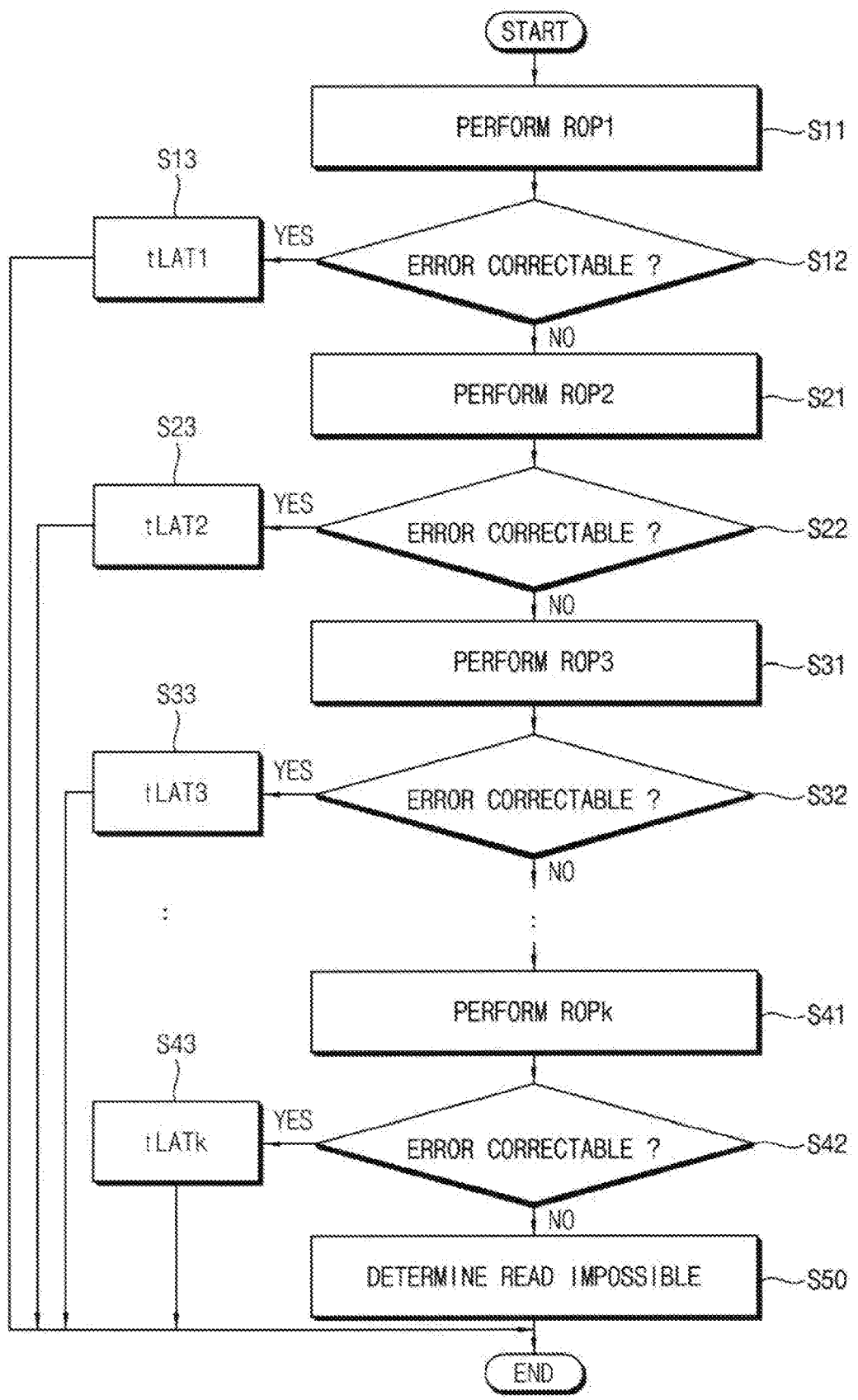
FIG. 9 is a flowchart illustrating a method of reading data according to the read sequence of FIG. 8.

FIG. 9 is a flowchart illustrating a method of reading data according to the read sequence of FIG. 8.

Referring to FIG. 9, according to the read sequence RSEQ, the first read operation ROP1 of the highest priority is performed (S11). Here, as with the example of FIG. 8, it is assumed that each read operation is performed in conjunction with ECC decoding. Thus, when error(s) in the read data are determined to be correctable by the ECC decoding (S12: YES), the first read time tRD1 of the first read operation ROP1 is determined as the read latency tLAT1 (S13). Thus, as the error(s), if any, are correctable, valid data is obtained and the read sequence RSEQ is ended.

However, when error(s) are not correctable (S12: NO), the second read operation ROP2 of the next priority is performed (S21). Again, if the resulting error(s) in the read data, if any, are determined to be correctable by the ECC decoding (S22: YES), the sum tRD1+tRD2 of the read times of the first and second read operations ROP1 and ROP2 is determined as the read latency tLAT2 (S23).

However, if the error(s) are not correctable (S22: NO), the third read operation ROP3 of the next priority is performed (S31). Again, if error(s) in the read data, if any, are determined to be correctable by the ECC decoding (S32: YES), the sum tRD1+tRD2+tRD3 of the read times of the first, second and third read operations ROP1, ROP2 and ROP3 is determined as the read latency tLAT3 (S33).

In this manner, so long as valid data is not obtained through the execution of read operations having the higher priorities, variously set read operations are sequentially performed up until a last read operation ROPk is performed (S41). So finally, if the error(s) in the read data, if any, are determined to be correctable by the ECC decoding (S42: YES), then a sum tRD1+tRD2+ . . . +tRDk of the read times of all read operations ROP1~ROPk is determined as the read latency tLATk (S43).

Yet, if valid data is not obtained by the last read operation ROPk, it is determined that the current read operation is impossible (S50) (i.e., a read fail occurs), and the read sequence RSEQ is ended.

If the operating conditions are not too adverse, valid data will be obtained by the first read operation ROP1 in many cases. Thus, the read latency may be minimized by use of the illustrated read sequence, such that execution of the overall read operation may be performed with minimal practical read latency. However, if the operating conditions degrade, valid data will probably not be obtained by use of only the first read operation. Therefore, second and possibly subsequent read operations having respective priorities may be performed. This necessity will obviously extend the read latency of the overall read operation. Thus, the performance of a nonvolatile memory device may be enhanced by setting a plurality of read sequences respectively corresponding to different operating conditions, wherein the use of a particular read sequence among the plurality of read sequences may be adaptively selected.

As will be described below with reference to FIGS. 10 through 20, the operating conditions such as a read level set, a reliability level, a read sequence, etc. may be optimized for changes of the operating conditions according to example embodiments.

Figures 10, 11:
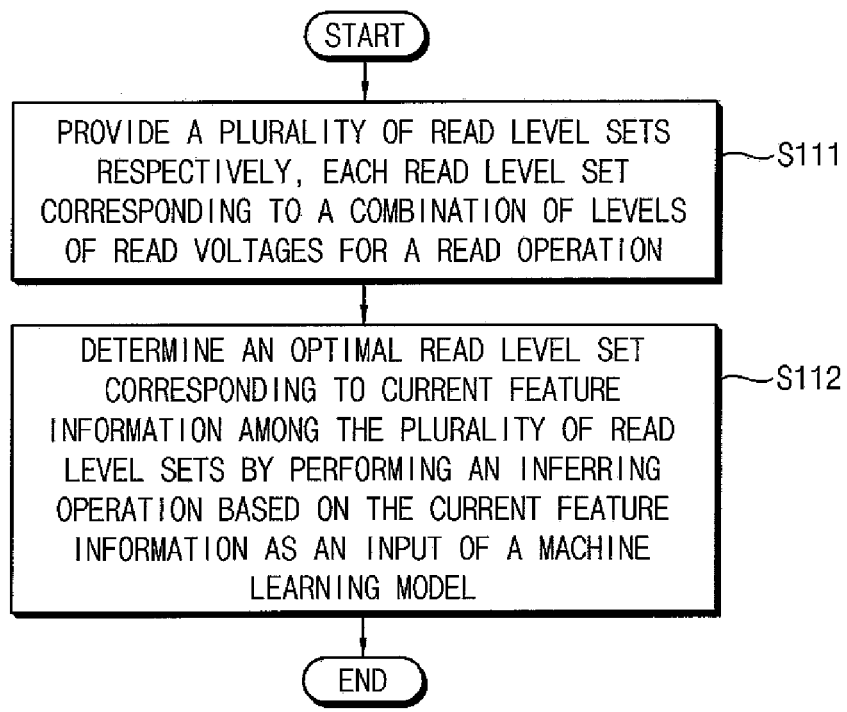
FIG. 10 is a flow chart illustrating an example embodiment of determining operating conditions in a method of controlling an operation of a nonvolatile memory device according to example embodiments.
FIG. 11 is a diagram illustrating example read sequence sets for determining operating conditions of FIG. 10.

FIG. 10 is a flow chart illustrating an example embodiment of determining operating conditions in a method of controlling an operation of a nonvolatile memory device according to example embodiments, and FIG. 11 is a diagram illustrating example read sequence sets for determining operating conditions of FIG. 10.

Referring to FIGS. 1, 10 and 11, a plurality of read level sets RLS1~RLS3 are provided such that each read level set RLSi (i=1, 2, 3) may correspond to a combination of levels VLij (j=1~m) of read voltages VR1~VRm for a read operation of the nonvolatile memory device (S111), The plurality of read level sets RLS1~RLS3 may be stored as a form of the setting table STTBL in the buffer memory 40 in FIG. 1.

An optimal read level set corresponding to the current feature information FTRINF_C may be determined among the plurality of read level sets RLS1~RLS3 by performing the inferring operation based on the current feature information FTRINF_C as an input of the machine learning model (S112).

In some example embodiments, the optimum read level set may be determined respectively with respect to each of a plurality of memory planes included in the nonvolatile memory device or with respect to each of a plurality of memory blocks included in the nonvolatile memory device.

Figures 12, 13:
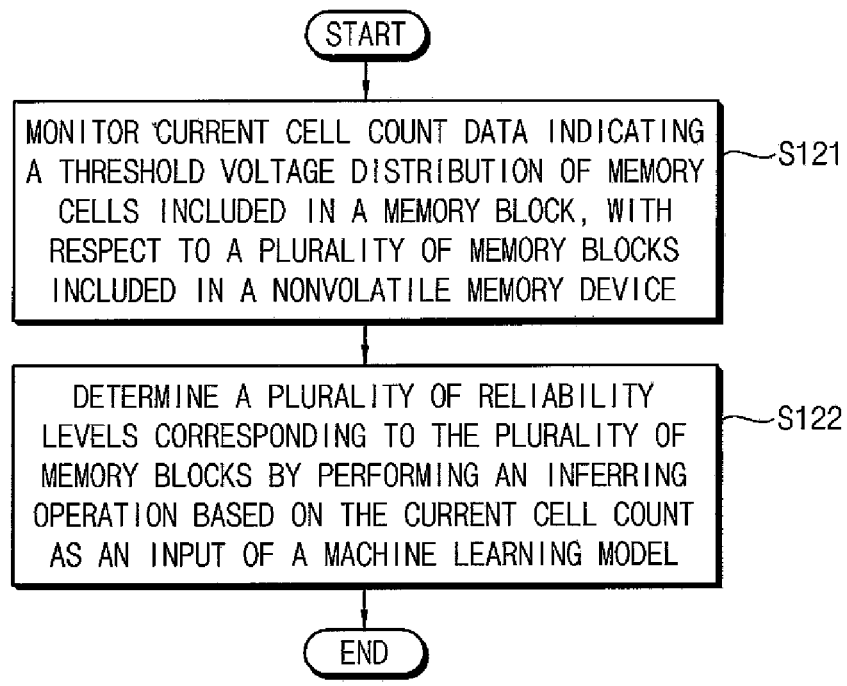
FIG. 12 is a flow chart illustrating an example embodiment of determining operating conditions in a method of controlling an operation of a nonvolatile memory device according to example embodiments.
FIG. 13 is a diagram illustrating reliability levels according to determining operating conditions of FIG. 12.

FIG. 12 is a flow chart illustrating an example embodiment of determining operating conditions in a method of controlling an operation of a nonvolatile memory device according to example embodiments, and FIG. 13 is a diagram illustrating reliability levels according to determining operating conditions of FIG. 12.

Referring to FIGS. 12 and 13, current cell count data indicating threshold voltage distribution of memory cells in a memory block may be monitored with respect to each of a plurality of memory blocks included in the nonvolatile memory device (S121).

A plurality of reliability levels corresponding to the plurality of memory blocks may be determined by performing the inferring operation based on the current cell count as an input of the machine learning model such that each reliability level may indicate a lifetime of data stored in each memory block (S122).

In some example embodiments, the operation of monitoring the current cell count data and the operation of determining the plurality of reliability levels may be performed periodically. FIG. 13 illustrates an example of the reliability levels RL1~RL4 for respective memory blocks BLK1~BLK4 that are determined at time points T1~T4. In FIG. 13, RLi indicates the higher reliability level than RLi+1, that is, R1 is the highest reliability level and R4 is the lowest reliability level. As a result, FIG. 13 illustrates that the reliability levels of the memory blocks BLK1~BLK4, in which data are stormed, may be decreased gradually over time.

A rewrite operation may be performed with respect to data stored in the plurality of memory blocks based on the plurality of reliability levels. For example, if the reliability level RL4 of the memory block BLK3 is lower than a predetermine reference level, the rewrite operation may be performed with respect to the memory block BLK3, and the memory block BLK3 may be initialized to have the highest reliability level RL1.

Figure 14:
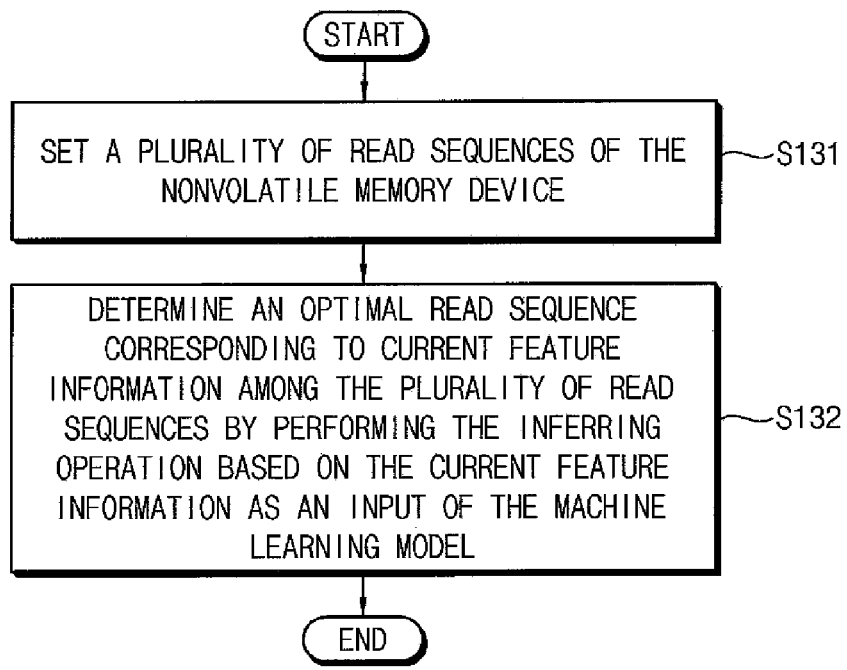
FIG. 14 is a flow chart illustrating an example embodiment of determining operating conditions in a method of controlling an operation of a nonvolatile memory device according to example embodiments.

FIG. 14 is a flow chart illustrating an example embodiment of determining operating conditions in a method of controlling an operation of a nonvolatile memory device according to example embodiments.

Referring to FIG. 14, a plurality of read sequences of the nonvolatile memory device may be set (S131). The plurality of read sequences, which will be described with reference to FIGS. 16 through 18, may be stored as a form of the setting table STTBL in the buffer memory 40 in FIG. 1.

An optimal read sequence corresponding to current feature information may be determined among the plurality of read sequences by performing the inferring operation based on the current feature information as an input of the machine learning model (S132).

Figure 15:
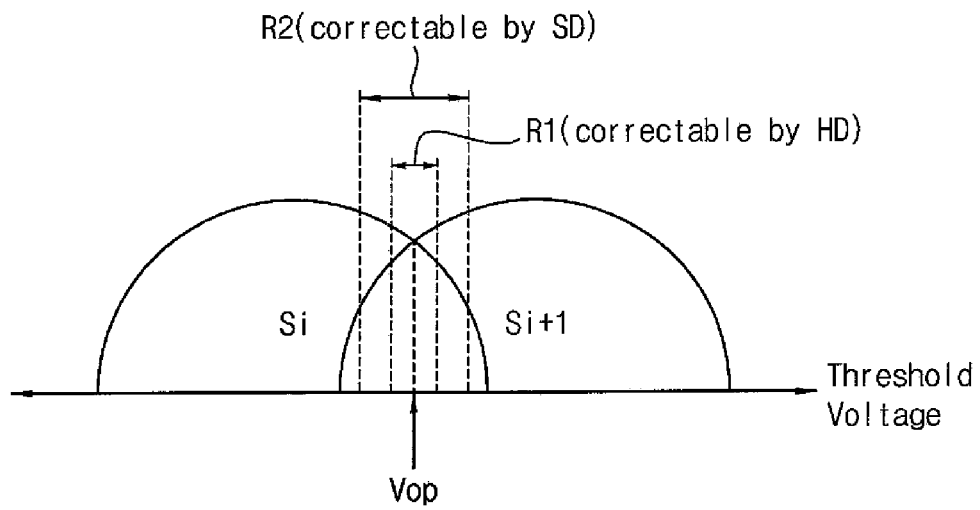
FIG. 15 is a diagram for describing a predetermined read voltage and an optimal read voltage.

FIG. 15 is a diagram for describing a predetermined read voltage and an optimal read voltage.

Threshold voltage distributions for two adjacent states Si and Si+1 are shown in FIG. 15 assuming the use of a flash memory device in one embodiments of the disclosure. However, those skilled in the art will recognize that the description that follows may be applied to adjacent resistance distributions in a case where a resistive memory device is assumed.

An optimal read voltage Vop is a read voltage leading to a minimum number of error bits among data bits that are read out simultaneously. The optimal read voltage Vop corresponds to a valley, that is, a cross point of the threshold voltage distributions of the two states Si and Si+1. When the distributions are shifted and/or broadened according to change of the operating condition, the difference between the predetermined read voltage and the optimal read voltage increases. As this difference increases, the BER or the probability of the read fail also increases.

When the predetermined voltage is included in a first voltage range R1, the error in the read data may be corrected by the ECC decoding with hard decision (HD). When the predetermined voltage is included in a second voltage range R2, the error in the read data may be corrected by the ECC decoding with soft decision (SD). Examples of certain HD and SD will be described in some additional detail with reference to FIGS. 19 and 20.

Figure 16:
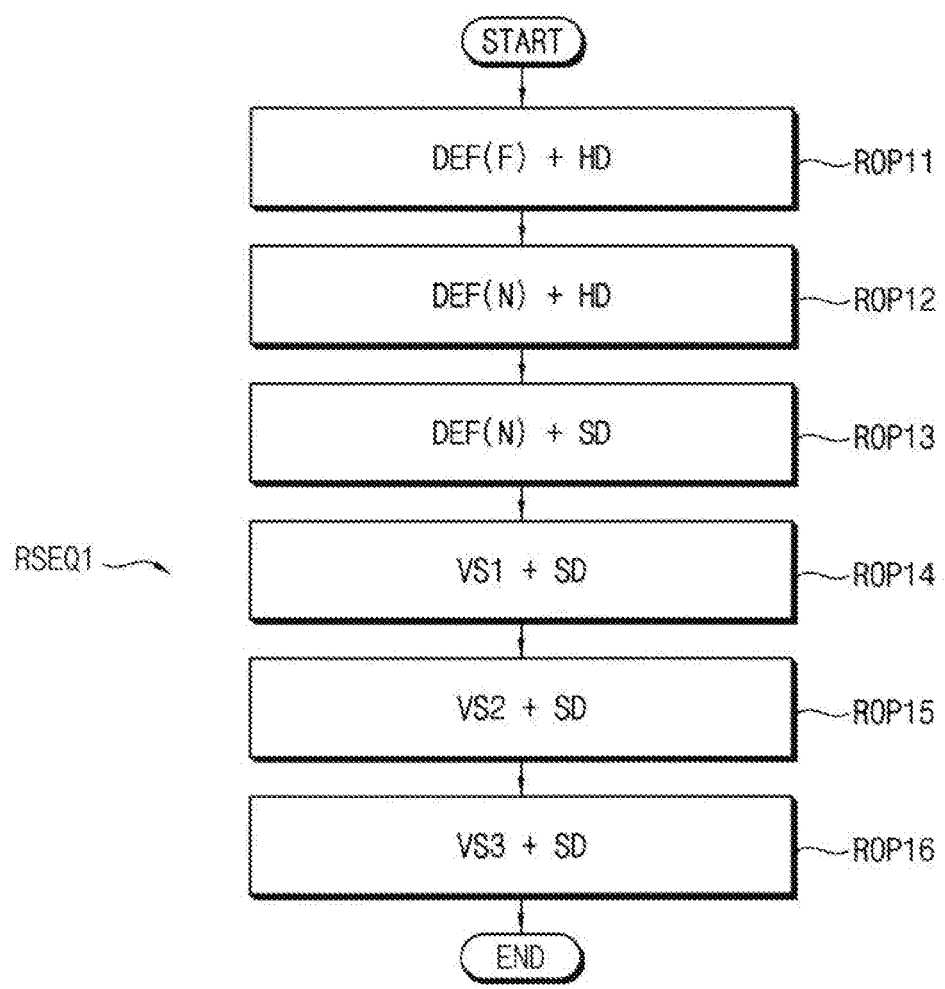
FIGS. 16, 17 and 18 are diagrams illustrating read sequences according to an example embodiment.
Figure 17:
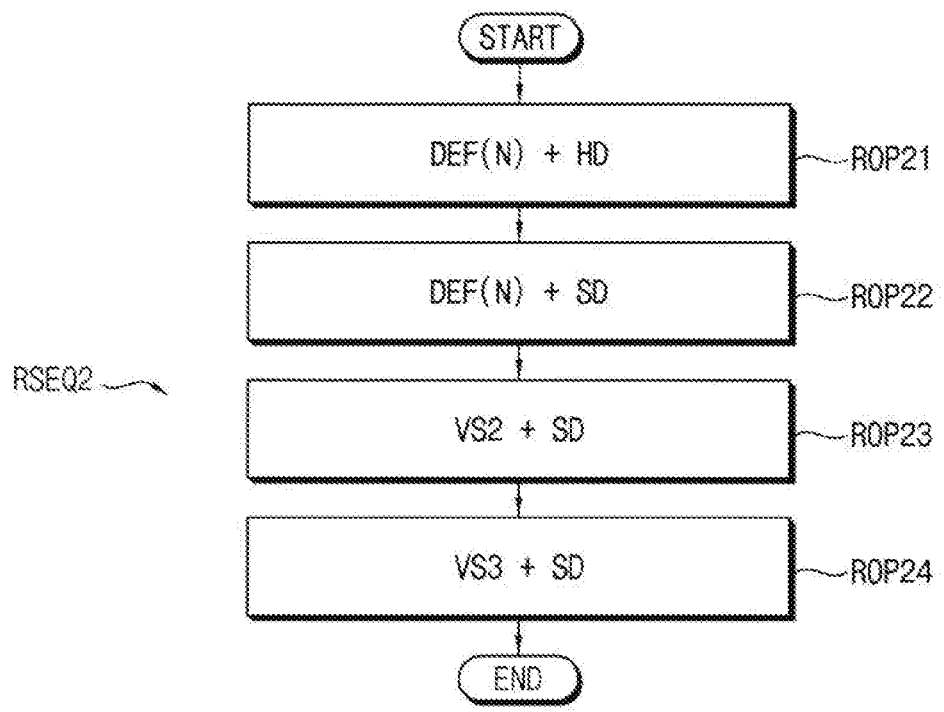
Figure 18:
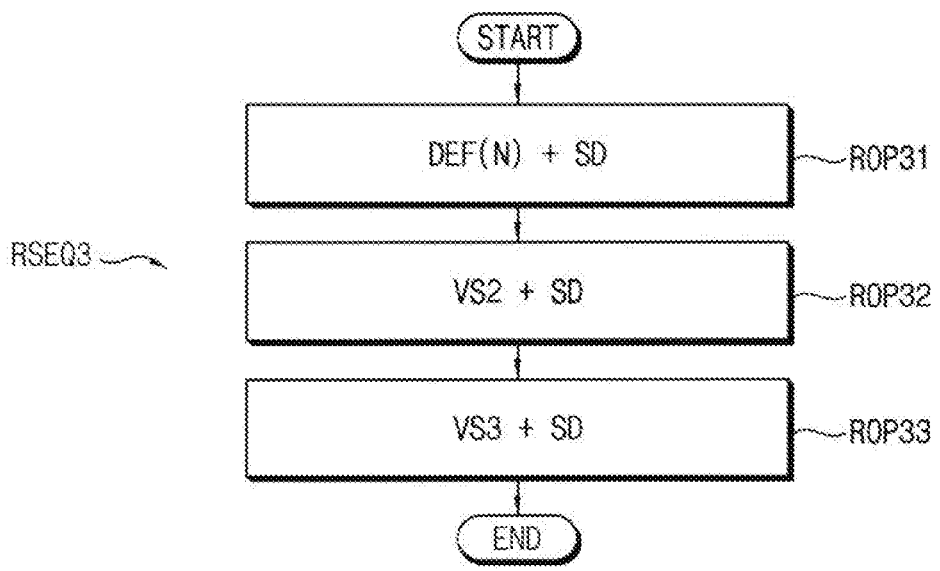

When bit errors in the read data are too numerous and the predetermined read voltage is out of the second range R2, valid data will not be obtained using applicable ECC decoding. When valid data is not obtained by execution of previous read operations based on the predetermined read voltage, a valley search operation may be performed to determine the optimal read voltage Vop. Thereafter, a read operation may be performed using the optimal read voltage. Such valley search operations and read operations based on an optimal read operation may be referred to as a "voltage-compensation read operation". In some embodiments, each of the read sequences may include a read operation based on the predetermined read voltage with the higher priority, and the at least one voltage-compensation read operation with the lower priority, as illustrated in FIGS. 16, 17 and 18. The valley search operations take too much time and degrade the performance of the nonvolatile memory device and the storage system including the nonvolatile memory device.

According to example embodiments, the read level set and the read sequence may be optimized for user environments by performing the learning operation and the inferring operation using machine learning.

FIGS. 16, 17 and 18 are diagrams illustrating read sequences according to an example embodiment.

The read sequences in FIGS. 16, 17 and 18 are non-limiting examples for describing the disclosure.

Referring to FIG. 16, the first read sequence RSEQ1 may include first through sixth read operations ROP11~ROP16, which are arranged according to respective priorities. The first, second and third read operations ROP11, ROP12 and ROP13 may be based on the predetermined read voltage, and the fourth, fifth and sixth read operations ROP14, ROP15 and ROP16 may be the voltage-compensation read operations.

As described above, a read operation having the shorter read time may be performed before a read operation having the longer read time. In other words, the priority of the read operations may be higher as the read time is shorter. The first read operation ROP11 having the shortest read time, that is, the first read time tRD11 may be performed first, the second read operation ROP12 having the second read time tRD12 longer than the first read time tRD11 is performed after the first read operation ROP11, and likely the sixth read operation ROP16 having the longest read time tRD16 is performed lastly.

Each of the first and second read operations ROP11 and ROP12 may be a hard decision (HD) read operation that reads out hard decision data using the predetermined read voltage and performs the ECC decoding based on the hard decision data. The first read operation ROP11 may be a fast read operation DEF(F) based on the predetermined read voltage and the second read operation ROP12 may be a normal read operation DEF(N) based on the predetermined read voltage.

The third read operation ROP13 may be a soft decision (SD) read operation that reads out the hard decision data using a normal read operation DEF(N) based on the predetermined read voltage, provides reliability information of the hard decision data using a plurality of read voltages around the predetermined read voltage, and performs the ECC decoding based on the hard decision data and the reliability information.

The fourth, fifth and sixth read operations ROP14, ROP15 and ROP16 may combine soft decision (SD) with the voltage-compensation read operations including the valley search operations VS1, VS2 and VS3 and the read operations based on the detected optimal read voltages, respectively. The valley search operations VS1, VS2 and VS3 may be variously implemented to have different search times and different reading accuracies.

Referring to FIG. 17, the second read sequence RSEQ2 may include first through fourth read operations ROP21~ROP24, which are arranged according to respective priorities. The first and second read operations ROP21 and ROP22 may be based on the predetermined read voltage, and the third and fourth read operations ROP23 and ROP24 may be the voltage-compensation read operations.

As described above, the read operation having the shorter read time may be performed before the read operation having the longer read time. The first read operation ROP21 having the shortest read time, that is, the first read time tRD21 may be performed first, the second read operation ROP22 having the second read time tRD22 longer than the first read time tRD21 is performed after the first read operation ROP21, and likely the fourth read operation ROP24 having the longest read time tRD24 is performed lastly. The notations DEF(N), HD, SD, VS2 and VS3 are the same as described with reference to FIG. 16.

Referring to FIG. 18, the third read sequence RSEQ3 may include first, second and third read operations ROP31, ROP32 and ROP33, which are arranged according to respective priorities. The first read operation ROP31 may be based on the predetermined read voltage, and the second and third read operations ROP32 and ROP33 may be the voltage-compensation read operations.

As described above, the read operation having the shorter read time may be performed before the read operation having the longer read time. The first read operation ROP31 having the shortest read time, that is, the first read time tRD31 may be performed first, the second read operation ROP32 having the second read time tRD32 longer than the first read time tRD31 is performed after the first read operation ROP31, and the last read operation ROP33 having the longest read time tRD33 is performed lastly. The notations DEF(N), SD, VS2 and VS3 are the same as described with reference to FIG. 16.

For example, the first read sequence RSEQ1 of FIG. 16 may be set for the operating condition of the relatively lower range of the BER, the second read sequence RSEQ2 of FIG. 17 may be set for the operating condition of the intermediate range of the BER, and the third read sequence RSEQ3 of FIG. 18 may be set for the operating condition of the relatively higher range of the BER. As such, the performance of the nonvolatile memory device may be improved by setting a plurality of read sequences respectively corresponding to the different operating conditions and adaptively controlling the read sequences.

Figure 19:
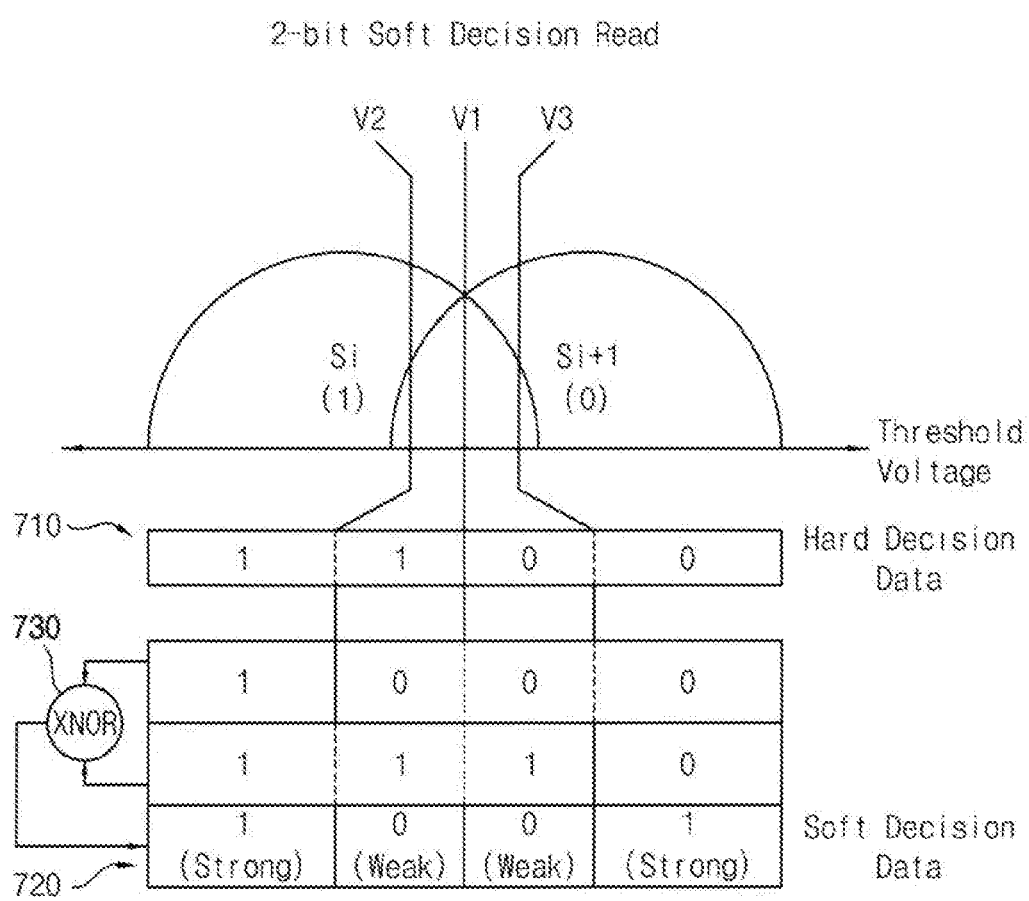
FIG. 19 is a diagram illustrating an example of a 2-bit soft decision read operation.
Figure 20:
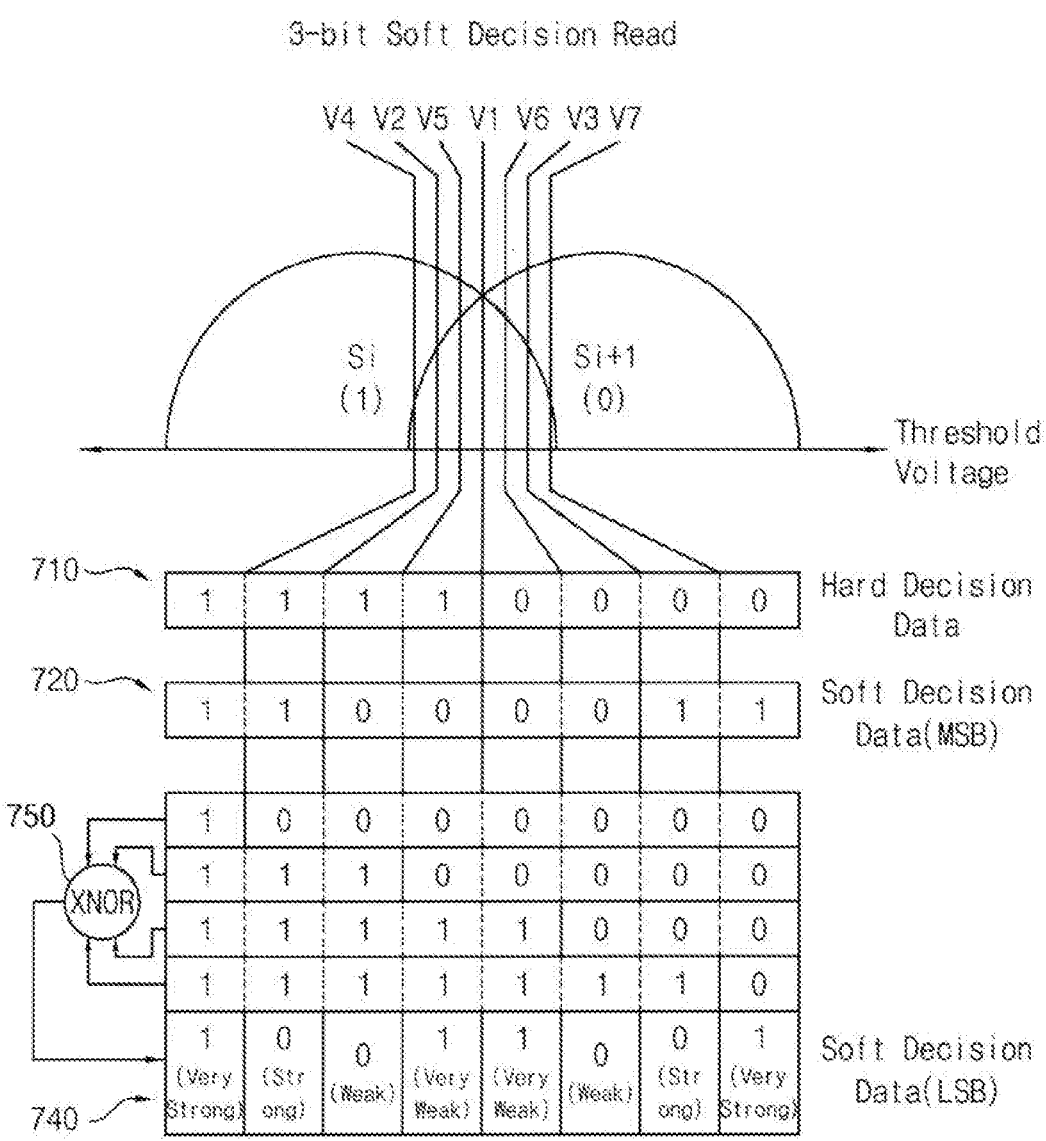
FIG. 20 is a diagram illustrating an example of a 3-bit soft decision read operation.

FIG. 19 is a diagram illustrating an example of a 2-bit soft decision read operation, and FIG. 20 is a diagram illustrating an example of a 3-bit soft decision read operation.

As illustrated in FIG. 19, the nonvolatile memory device may perform a 2-bit soft decision read operation. The 2-bit soft decision read operation may include three read operations using three voltages V1, V2 and V3 having regular intervals. For example, the three voltages V1, V2 and V3 may include a first voltage V1 having a predetermined reference level for distinguishing between a first state Si corresponding to data '1' and a second state Si+1 corresponding to data '0', a second voltage V2 lower by a predetermined level than the first voltage V1, and a third voltage V3 higher by the predetermined level than the first voltage V1. In some embodiments, data 710 read by using the first voltage V1 having the reference level may be hard decision data 710 read by a hard decision read operation, and the 2-bit soft decision read operation may use the hard decision data 710 read by the hard decision read operation without applying the first voltage V1 having the reference level. The 2-bit soft decision read operation may generate soft decision data 720 having reliability information for the hard decision data 710 by performing a predetermined logical operation (e.g., an XNOR operation 730) (or encoding) on data read by using the second voltage V2 and data read by using the third voltage V3. Each bit of the soft decision data 720 may represent a degree of reliability of a corresponding bit of the hard decision data 710. For example, a bit of the soft decision data 720 having a value of '1' may represent that a corresponding bit of the hard decision data 710 has strong (S) reliability, and a bit of the soft decision data 720 having a value of '0' may represent that a corresponding bit of the hard decision data 710 has weak (W) reliability.

As illustrated in FIG. 20, the nonvolatile memory device may perform a 3-bit soft decision read operation. The 3-bit soft decision read operation may include seven read operations using seven voltages V1, V2, V3, V4, V5, V6 and V7 having regular intervals. For example, the seven voltages V1, V2, V3, V4, V5, V6 and V7 may include the three voltages V1, V2 and V3 used in the 2-bit soft decision read operation, and may further include a fourth voltage V4 lower than the second voltage V2, a fifth voltage V5 between the second voltage V2 and the first voltage V1, a sixth voltage V6 between the first voltage V1 and the third voltage V3, and seventh voltage V7 higher than the third voltage V3. In some embodiments, the data 710 read by using the first voltage V1 may be the hard decision data 710 read by the hard decision read operation. The data 720 read by using the second and third voltages V2 and V3 may be most significant bit (MSB) soft decision data 720 corresponding to the soft decision data 720 read by the 2-bit soft decision read operation. The 3-bit soft decision read operation may generate least significant bit (LSB) soft decision data 740 by performing a predetermined logical operation (e.g., an XNOR operation 750) (or encoding) on data read by using the fourth voltage V4, the fifth voltage V5, the sixth voltage V6 and the seventh voltage V7. Each soft decision data 720 and 740 having two bits may represent a degree of reliability of a corresponding bit of the hard decision data 710. For example, each soft decision data 720 and 740 having a value of '11' may represent that a corresponding bit of the hard decision data 710 has very strong (VS) reliability, each soft decision data 720 and 740 having a value of '10' may represent that a corresponding bit of the hard decision data 710 has strong (S) reliability, each soft decision data 720 and 740 having a value of '00' may represent that a corresponding bit of the hard decision data 710 has weak (W) reliability, each soft decision data 720 and 740 having a value of '01' may represent that a corresponding bit of the hard decision data 710 has very weak (VW) reliability.

Although FIGS. 19 and 20 illustrate two adjacent states Si and Si+1, the 2-bit soft decision read operation and the 3-bit soft decision read operation illustrated in FIGS. 19 and 20 may be performed to distinguish between any two adjacent states of a plurality of states. The memory cell of the nonvolatile memory device may be a multi-level cell (MLC) that is programmed in one $2^N$ states to store N-bit data. Although FIGS. 19 and 20 illustrate the MLC storing two or three bits, example embodiments may be applied to the MLC storing four or more bits.

Figure 21:
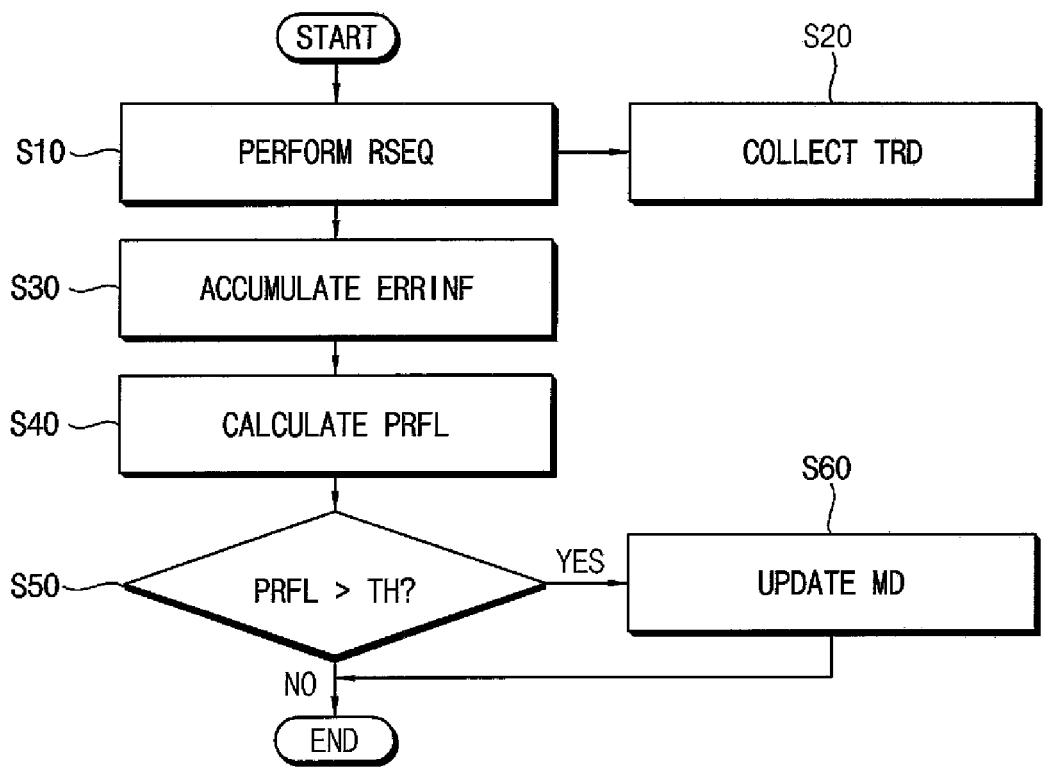
FIG. 21 is a flow chart illustrating a method of controlling an operation of a nonvolatile memory device according to example embodiments.

FIG. 21 is a flow chart illustrating a method of controlling an operation of a nonvolatile memory device according to example embodiments.

Referring to FIG. 21, the read sequence RSEQ that is determined as described with reference to FIGS. 14 through 20 may be performed (S10). The training data TRD may be collected based on the read sequence RSEQ and the results of ECC decoding (S20). The error information ERRINF indicating the results of ECC decoding may be accumulated (S30), and a probability of a failure of ECC decoding may be calculated based on the accumulated error information ERRINF (S40). When the probability PRFL is higher than a reference value TH (S50: YES), the machine learning model MD may be updated by performing the learning operation (S60). When the probability PRFL is not higher than a reference value TH (S50: NO), the machine learning model MD may be maintained.

As such, the timing of performing the learning operation may be determined based on the probability PRFL of the failure of the ECC decoding. In some example embodiments, the probability PRFL of the failure may be that of the hard decision read operation. In some example embodiments, the read latency may be monitored as described with reference to FIGS. 8 and 9, the probability PRFL for determining the timing of performing the learning operation may be determined based on the monitored read latency. In some example embodiments, the timing of performing the learning operation may be determined based on a probability of a failure of the inferring operation.

Figure 22:
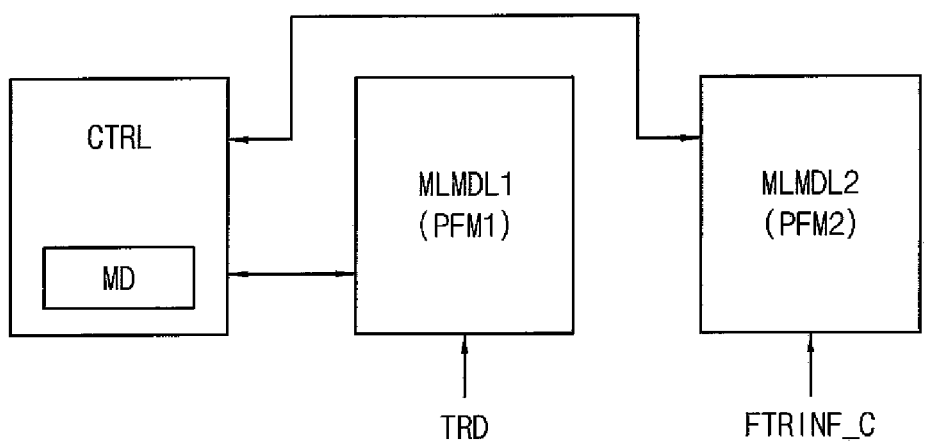
FIG. 22 is a machine learning engine according to example embodiments.

FIG. 22 is a machine learning engine according to example embodiments.

Referring to FIG. 22, a machine learning engine 21 may include a controller CTRL, a first machine learning module MLMDL1 and a second machine learning module MLMDL2. The controller may drive the machine learning module MLMDL to update a machine learning model MD.

The first machine learning module MLMDL1 may have a first performance PFM1 and perform the learning operation based on the training data TRD. The second machine learning module MLMDL2 may have a second performance PFM2 higher than the first performance PFM1, and perform the inferring operation based on the current feature information FTRINF_C. Through such dual structuring, the inferring operation requiring high speed may not be delayed even though latency occurs during the learning operation.

In some example embodiments, a first number of nodes simultaneously performing node operations in the first machine learning model MLMDL1 may be smaller than a second number of nodes simultaneously performing node operations in the second machine learning model MLMDL2. In some example embodiments, a first hardware performance (e.g., a frequency of an operation clock signal) of the first machine learning model MLMDL1 may be lower than a second hardware performance of the second machine learning model MLMDL2.

Figure 23:
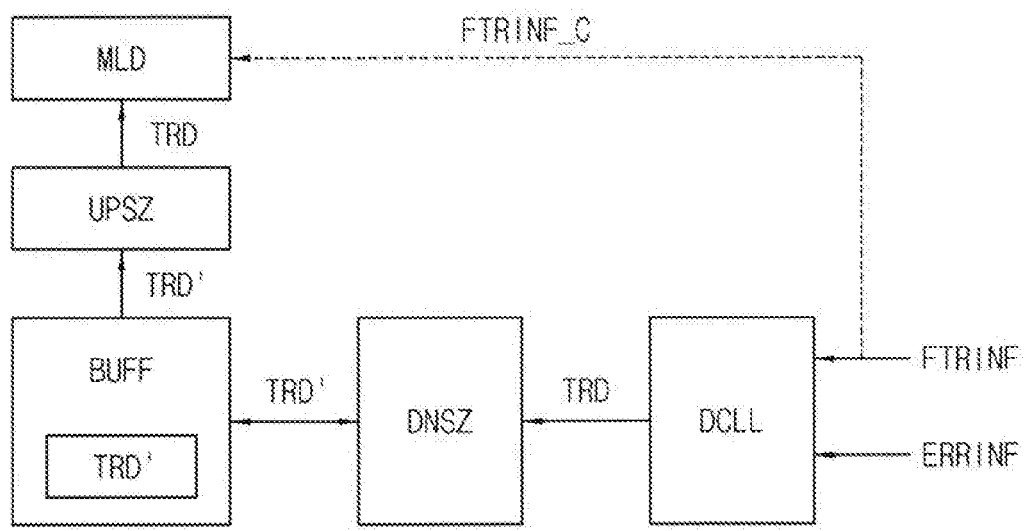
FIGS. 23 and 24 are block diagrams illustrating a machine learning device included in a storage system according to example embodiments.
Figure 24:
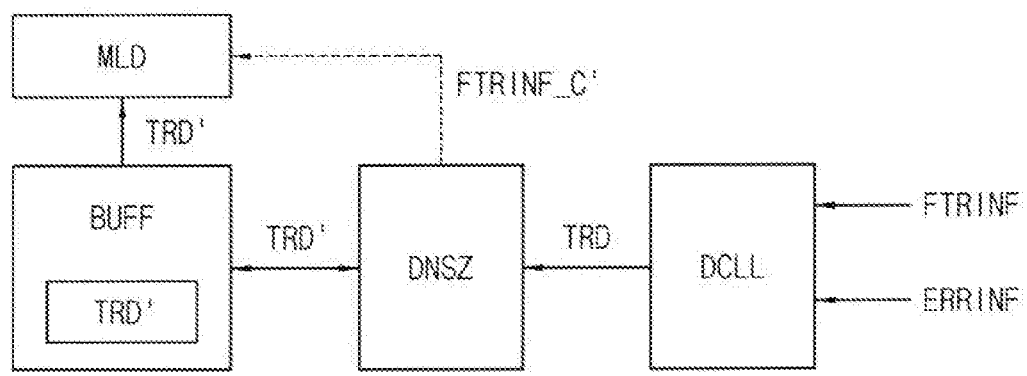

FIGS. 23 and 24 are block diagrams illustrating a machine learning device included in a storage system according to example embodiments.

As illustrated in FIGS. 23 and 24, a size of the training data TRD may be reduced and a size-reduced training data may be stored in a buffer memory. Hereinafter, descriptions repeated with FIG. 1 may be omitted.

In some example embodiments, the training data TRD may be compressed and the size-reduced training data TRD' may be stored in the buffer memory BUFF. The compression scheme may be a lossless compression scheme or a lossy compression scheme. In some example embodiments, the training data TRD may be normalized and the size-reduced training data TRD' may be stored in the buffer memory BUFF. Here, "normalization" represents that values of data are reduced proportionally such that the range of the values may be narrowed. As such, the memory capacity of the buffer memory BUFF may be reduced or used efficiently by reducing the training data TRD and storing the size-reduced training data TRD'.

Referring to FIG. 23, a machine learning device 11 may include a machine learning engine MLD, a data collector DCLL, a buffer memory BUFF, a downsizing unit DNSZ and an upsizing unit UPSZ. The downsizing unit DNSZ may compress or normalize the training data TRD to store the size-reduced training data TRD' in the buffer memory BUFF The upsizing unit UPSZ may restore the training data TRD based on the size-reduced training data TRD' stored in the buffer memory BUFF and provide the training data TRD to the machine learning engine MLD. The machine learning engine MLD may perform the learning operation based on the training data TRD and perform the inferring operation based on the current feature information FTRINF_C.

In comparison with the machine learning device 11 of FIG. 23, the upsizing unit UPSZ is omitted in a machine learning device 12 of FIG. 24. In this case, the machine learning engine MLD may perform the learning operation based on the size-reduced training data TRD'. The downsizing unit DNSZ may provide size-reduced current feature information FTRINF_C' during the inferring operation and the machine learning engine MLD may perform the inferring operation based on size-reduced current feature information FTRINF_C'.

Figure 25:
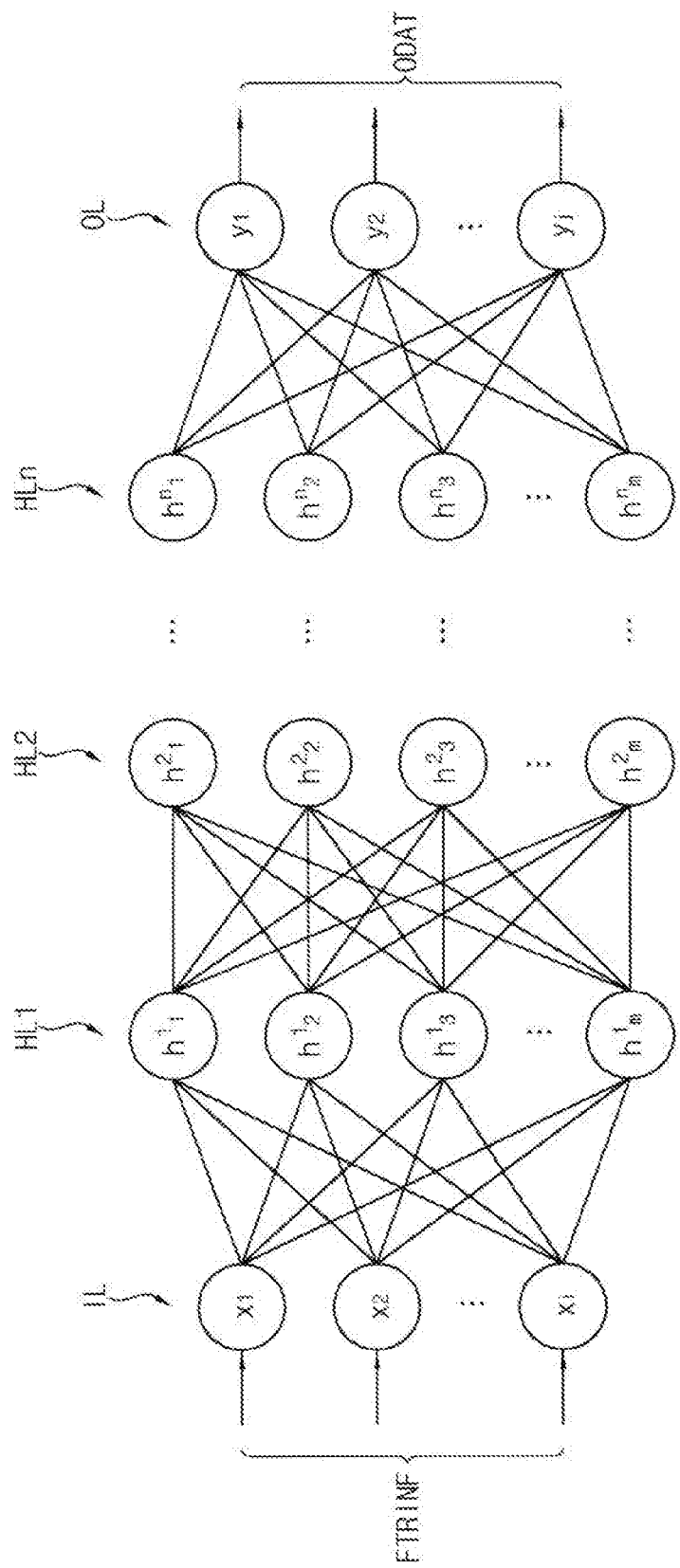
FIGS. 25 and 26 are diagrams for describing examples of a deep learning neural network structure that is driven by a machine learning device according to example embodiments.
Figure 26:
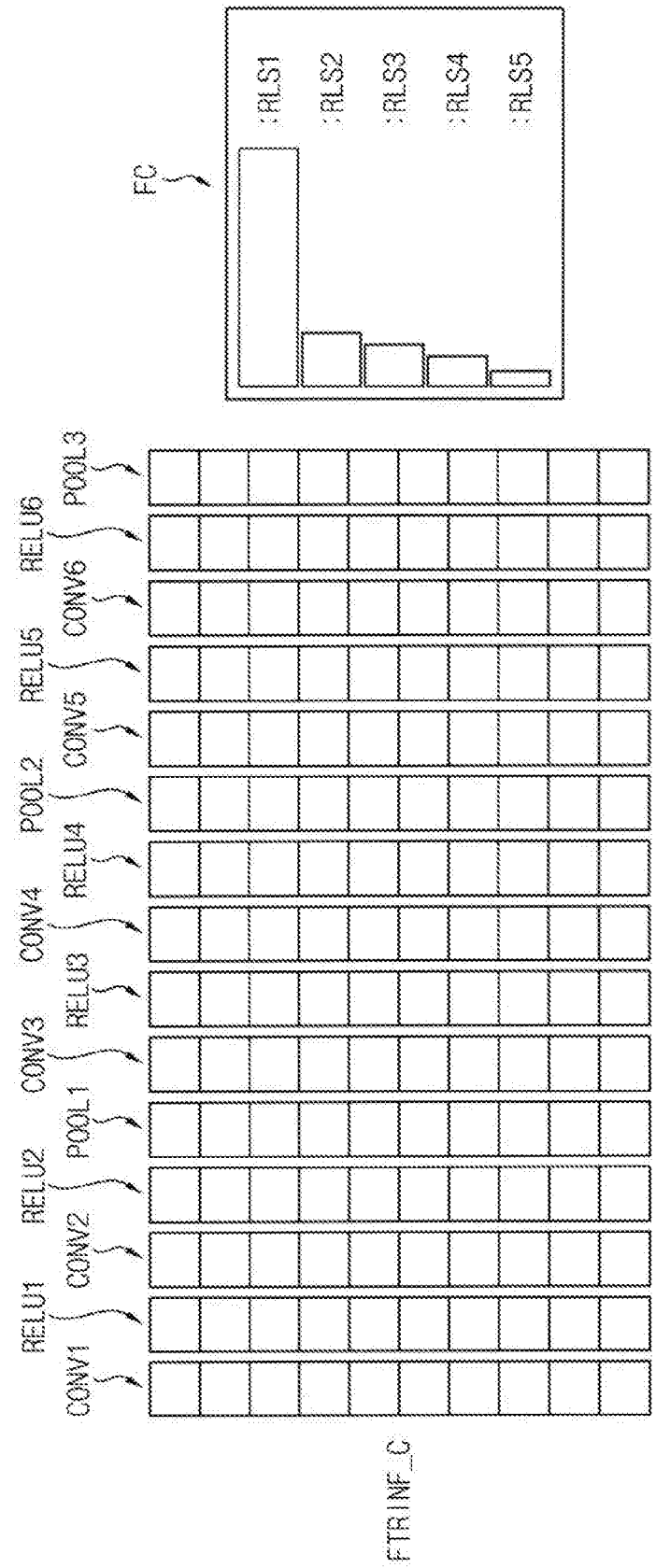

FIGS. 25 and 26 are diagrams for describing examples of a deep learning neural network structure that is driven by a machine learning device according to example embodiments.

Referring to FIG. 25, a general neural network may include an input layer IL, a plurality of hidden layers HL1, HL2, . . . , HLn and an output layer OL.

The input layer IL may include i input nodes $x_1$, $x_2$, . . . , $x_i$, where i is a natural number. Feature information FTRINF (e.g., vector input data) whose length is i may be input to the input nodes $x_1$, $x_2$, . . . , $x_i$ such that each element of the feature information FTRINF is input to a respective one of the input nodes $x_1$, $x_2$, . . . , $x_i$.

The plurality of hidden layers HL1, HL2, . . . , HLn may include n hidden layers, where n is a natural number, and may include a plurality of hidden nodes $h^1_1$, $h^1_2$, $h^1_3$, . . . , $h^1_m$, $h^2_1$, $h^2_2$, $h^2_3$, . . . , $h^2_m$, $h''_2$, $h''_3$, . . . , $h''_m$. For example, the hidden layer HL1 may include m hidden nodes $h^1_1$, $h^1_2$, $h^1_3$, . . . , $h^1_m$, the hidden layer HL2 may include m hidden nodes $h^2_1$, $h^2_2$, $h^2_3$, . . . , $h^2_m$, and the hidden layer HLn may include m hidden nodes $h''_1$, $h''_2$, $h''_3$, . . . , $h''_m$, where m is a natural number.

The output layer OL may include j output nodes $y_1$, $y_2$, . . . , $y_j$, where j is a natural number. Each of the output nodes $y_1$, $y_2$, . . . , $y_j$ may correspond to a respective one of classes to be categorized. The output layer OL may output the output values (e.g., class scores or simply scores) ODAT associated with the feature information FTRINF for each of the classes. The output layer OL may be referred to as a fully-connected layer and may indicate, for example, a probability that the feature information FTRINF corresponds to each operation condition.

A structure of the neural network illustrated in FIG. 25 may be represented by information on branches (or connections) between nodes illustrated as lines, and a weighted value assigned to each branch. Nodes within one layer may not be connected to one another, but nodes of different layers may be fully or partially connected to one another.

Each node (e.g., the node $h^1_1$) may receive an output of a previous node (e.g., the node $x_1$), may perform a computing operation, computation or calculation on the received output, and may output a result of the computing operation, computation or calculation as an output to a next node (e.g., the node h21). Each node may calculate a value to be output by applying the input to a specific function, e.g., a nonlinear function.

Generally, the structure of the neural network may be set in advance, and the weighted values for the connections between the nodes are set appropriately using data having an already known answer of which class the data belongs to. The data with the already known answer is referred to as "training data," and a process of determining the weighted value is referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

Referring to FIG. 26, a convolutional neural network may include a plurality of layers CONV1, RELU1, CONV2, RELU2, POOL1, CONV3, RELU3, CONV4, RELU4, POOL2, CONV5, RELU5, CONV6, RELU6, POOL3 and FC.

Unlike the general neural network, each layer of the convolutional neural network may have three dimensions of width, height, and depth and thus data that is input to each layer may be volume data having three dimensions of width, height, and depth.

Each of convolutional layers CONV1, CONV2, CONV3, CONV4, CONV5 and CONV6 may perform a convolutional operation on the current feature information FTRINF_C. The convolutional operation represents an operation in which data is processed based on a mask with weighted values and an output value is obtained by multiplying input values by the weighted values and adding up the total multiplied values. The mask may be referred to as a filter, window, or kernel.

Each of RELU layers RELU1, RELU2, RELU3, RELU4, RELU5 and RELU6 may perform a rectified linear unit operation on inputs. Each of pooling layers POOL1, POOL2 and POOL3 may perform a down-sampling operation on input volume data along spatial dimensions of width and height. Typically, one convolutional layer (e.g., CONV1) and one RELU layer (e.g., RELU1) may form a pair of CONV/RELU layers in the convolutional neural network, pairs of the CONV/RELU layers may be repeatedly arranged in the convolutional neural network, and the pooling layer may be periodically inserted in the convolutional neural network, thereby reducing data size and extracting a data characteristic.

An output layer or a fully-connected layer FC may output results (e.g., class scores) of the current feature information FTRINF_C for each of the classes. For example, the input volume data corresponding to the current feature information FTRINF_C may be converted into a one-dimensional matrix or vector as the convolutional operation and the down-sampling operation are repeated. For example, the fully-connected layer FC may represent probabilities that the current feature information FTRINF_C corresponds to a plurality of read level sets RLS1~RLS5, respectively. As such, the read level set corresponding to the highest probability may be determined as the optimal read level set among a plurality of read level sets RLS1~RLS5.

Figure 27:
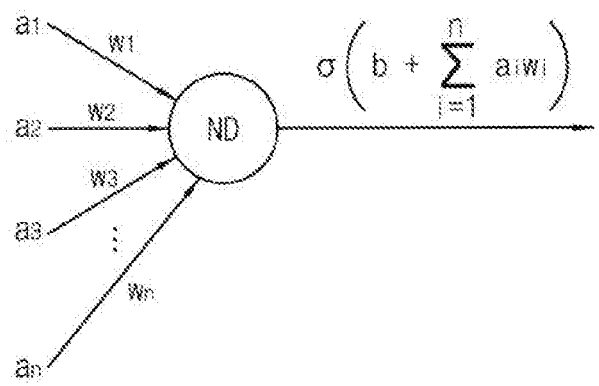
FIG. 27 is a diagram illustrating an example of a node included in a neural network.

FIG. 27 is a diagram illustrating an example of a node included in a neural network and an example node operation performed by a node ND in a neural network.

When N inputs $a_1$~$a_n$ are provided to the node ND, the node ND may multiply the n inputs $a_1$~$a_n$ and corresponding n weights $w_1$~$w_e$, respectively, may sum n values obtained by the multiplication, may add an offset "b" to a summed value, and may generate one output value by applying a value to which the offset "b" is added to a specific function "σ". The learning operation may be performed based on the training data TRD to update all nodes in the neural network.

Figure 28:
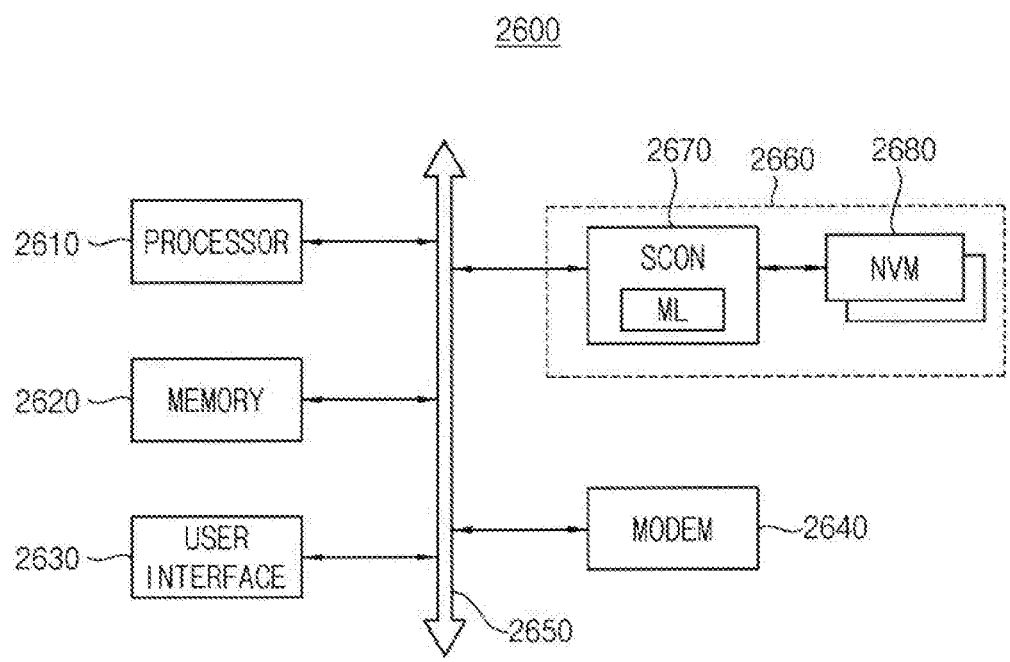
FIG. 28 is a diagram illustrating a storage system according to example embodiments.

FIG. 28 is a diagram illustrating a storage system according to example embodiments.

Referring to FIG. 28, a computing system 2600 includes a processor 2610, a memory device 2620, a user interface 2630, a bus 2650 and a storage system 2660. In some embodiments, the computing system 2600 may further include a modem 2640, such as a baseband chipset.

The processor 2610 may perform specific calculations or tasks. For example, the processor 2610 may be a microprocessor, a central processing unit (CPU), a digital signal processor, or the like. The processor 2610 may be coupled to the memory device 2620 via a bus 2650, such as an address bus, a control bus, and/or a data bus. Further, the processor 2610 may be coupled to an extension bus, such as a peripheral component interconnect (PCI) bus, and may control the user interface 2630 including at least one input device, such as a keyboard, a mouse, a touch screen, etc., and at least one output device, a printer, a display device, etc. The modem 2640 may perform wired or wireless communication with an external device.

The storage system 2660 may include a storage controller SCON 2670 and a nonvolatile memory device NVM 2680. The storage controller 2670 may include a machine learning device ML as described above to perform method of controlling an operation of a nonvolatile memory device according to example embodiments.

As described above, the method of controlling an operation of a nonvolatile memory device and the storage system according to example embodiments may provide optimized operating conditions for individual user environments by collecting training data in the storage system and performing the learning operation and the inferring operation based on the training data.

The disclosure may be applied to any electronic devices and systems including a nonvolatile memory device. For example, the disclosure may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. A method of controlling an operation of a nonvolatile memory device using machine learning, the method comprising:
   determining operating conditions of the nonvolatile memory device by performing an inferring operation using a machine learning model;
   collecting training data that are generated based on feature information and error information, the error information indicating results of error correction code (ECC) decoding of the nonvolatile memory device; and
   updating the machine learning model by performing a learning operation based on the training data,
   wherein the feature information includes physical addresses of the nonvolatile memory device and cell count data indicating threshold voltage distributions of memory cells corresponding to the physical addresses.

2. The method of claim 1, wherein the error information includes at least one a probability of a failure of the ECC decoding and an error number determined by the ECC decoding.

3. The method of claim 1, wherein determining the operating conditions comprises:
   providing a plurality of read level sets, each read level set corresponding to a combination of levels of read voltages for a read operation of the nonvolatile memory device; and
   determining an optimal read level set corresponding to current feature information among the plurality of read level sets by performing the inferring operation based on the current feature information as an input of the machine learning model.

4. The method of claim 3, wherein the optimum read level set is determined respectively with respect to each of a plurality of memory planes included in the nonvolatile memory device or with respect to each of a plurality of memory blocks included in the nonvolatile memory device.

5. The method of claim 1, wherein determining the operating conditions comprises:
   monitoring current cell count data indicating a threshold voltage distribution of memory cells in a memory block, with respect to each of a plurality of memory blocks included in the nonvolatile memory device; and
   determining a plurality of reliability levels corresponding to the plurality of memory blocks by performing the inferring operation based on the current cell count data as an input of the machine learning model, each reliability level indicating a lifetime of data stored in each memory block.

6. The method of claim 5, further comprising performing a rewrite operation with respect to data stored in the plurality of memory blocks based on the plurality of reliability levels.

7. The method of claim 5, wherein monitoring the current cell count data and determining the plurality of reliability levels are performed periodically.

8. The method of claim 1, wherein determining the operating conditions comprises:
   setting a plurality of read sequences of the nonvolatile memory device; and
   determining an optimal read sequence corresponding to current feature information among the plurality of read sequences by performing the inferring operation based on the current feature information as an input of the machine learning model.

9. The method of claim 1, wherein the learning operation is performed by a first machine learning module having a first performance, and the inferring operation is performed by a second machine learning module having a second performance higher than the first performance.

10. The method of claim 9, wherein a first number of nodes simultaneously performing node operations in the first machine learning model is smaller than a second number of nodes simultaneously performing node operations in the second machine learning model.

11. The method of claim 1, wherein collecting the training data comprises reducing a size of the training data to store a size-reduced training data in a buffer memory.

12. The method of claim 11, wherein reducing the size of the training data comprises compressing the training data.

13. The method of claim 11, wherein reducing the size of the training data comprises normalizing the training data.

14. The method of claim 1, further comprising determining a timing of performing the learning operation based on a probability of a failure of the inferring operation and a probability of a failure of the ECC decoding.

15. A method of controlling an operation of a nonvolatile memory device using machine learning, the method comprising:
   providing a plurality of read level sets, each read level set corresponding to a combination of levels of read voltages for a read operation of the nonvolatile memory device;
   determining an optimal read level set corresponding to current feature information among the plurality of read level sets by performing an inferring operation based on the current feature information as an input of a machine learning model;
   collecting training data that are generated based on feature information and error information, the feature information including physical addresses of the nonvolatile memory device and cell count data indicating threshold voltage distributions of memory cells corresponding to the physical addresses, the error information indicating results of error correction code (ECC) decoding of the nonvolatile memory device;
   updating the machine learning model by performing a learning operation based on the training data; and
   determining a timing of performing the learning operation based on a probability of a failure of the inferring operation and a probability of a failure of the ECC decoding.

16. A storage system comprising:
   a nonvolatile memory device; and
   a storage controller configured to control the nonvolatile memory device, the storage controller comprising:
      a data collector configured to collect training data that are generated based on feature information and error information, the error information indicating results of error correction code (ECC) decoding of the nonvolatile memory device;
      a buffer memory configured to store the training data; and
      a machine learning engine configured to determine operating conditions of the nonvolatile memory device by performing an inferring operation using a machine learning model and update the machine learning model by performing a learning operation based on the training data,
   wherein the feature information includes physical addresses of the nonvolatile memory device and cell count data indicating threshold voltage distributions of memory cells corresponding to the physical addresses.

17. The nonvolatile memory device of claim 16, wherein: the error information includes at least one a probability of a failure of the ECC decoding and an error number determined by the ECC decoding.

18. The nonvolatile memory device of claim 16, wherein the machine learning engine determines an optimal read level set corresponding to current feature information among a plurality of read level sets by performing the inferring operation based on the current feature information as an input of the machine learning model.

19. The nonvolatile memory device of claim 16, wherein the machine learning engine comprises:
   a first machine learning module configured to perform the learning operation with a first performance; and
   a second machine learning module configured to perform the inferring operation with a second performance higher than the first performance.

* * * * *